United States Patent [19]
Akimoto et al.

[11] Patent Number: 5,937,223
[45] Date of Patent: Aug. 10, 1999

[54] PROCESSING APPARATUS

[75] Inventors: Masami Akimoto, Kumamoto; Yoichi Deguchi, Machida, both of Japan

[73] Assignee: Tokyo Electron Limited, Tokyo, Japan

[21] Appl. No.: 08/966,247

[22] Filed: Nov. 7, 1997

[30] Foreign Application Priority Data

Nov. 8, 1996 [JP] Japan .................................. 8-296840
Nov. 11, 1996 [JP] Japan .................................. 8-312658

[51] Int. Cl.[6] .............................. G03D 5/00; B65G 49/07
[52] U.S. Cl. .......................... 396/604; 414/225; 414/935
[58] Field of Search .................................. 396/604, 611, 396/627; 134/61; 414/222, 225, 416, 226, 935, 937, 627, 626, 941

[56] References Cited

U.S. PATENT DOCUMENTS

| | | | |
|---|---|---|---|
| 5,339,128 | 8/1994 | Tateyama et al. | 396/604 |
| 5,364,222 | 11/1994 | Akimoto et al. | 414/416 |
| 5,431,179 | 7/1995 | Miyazaki et al. | 134/61 |
| 5,664,254 | 9/1997 | Ohkura | 396/611 |

FOREIGN PATENT DOCUMENTS 4-85812  3/1992  Japan .

*Primary Examiner*—D. Rutledge
*Attorney, Agent, or Firm*—Oblon, Spivak, McClelland, Maier & Neustadt, P.C.

[57] ABSTRACT

A processing apparatus comprises a plurality of processing sets, each set including a transport path extending vertically, a plurality of processing sections which are provided around the transport path and each have a plurality of processing units laid one on top of another vertically, which each perform a specific process on objects, and a main transport mechanism which moves along the transport path, loads the objects on and unloads the objects from each processing unit in the plurality of processing sections, and an inter-set transport mechanism for transporting objects between the adjacent processing sets.

31 Claims, 15 Drawing Sheets

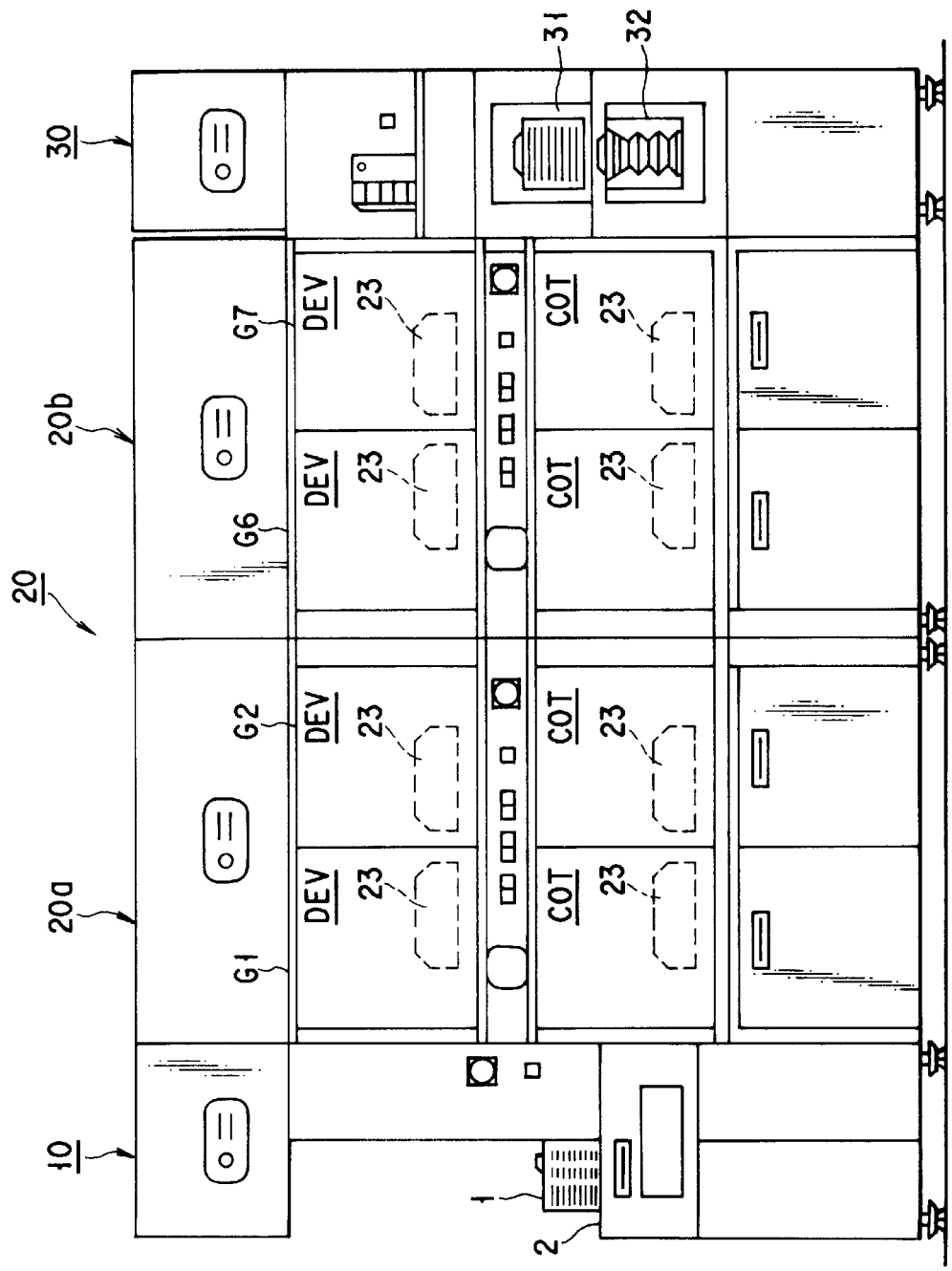
F I G. 2

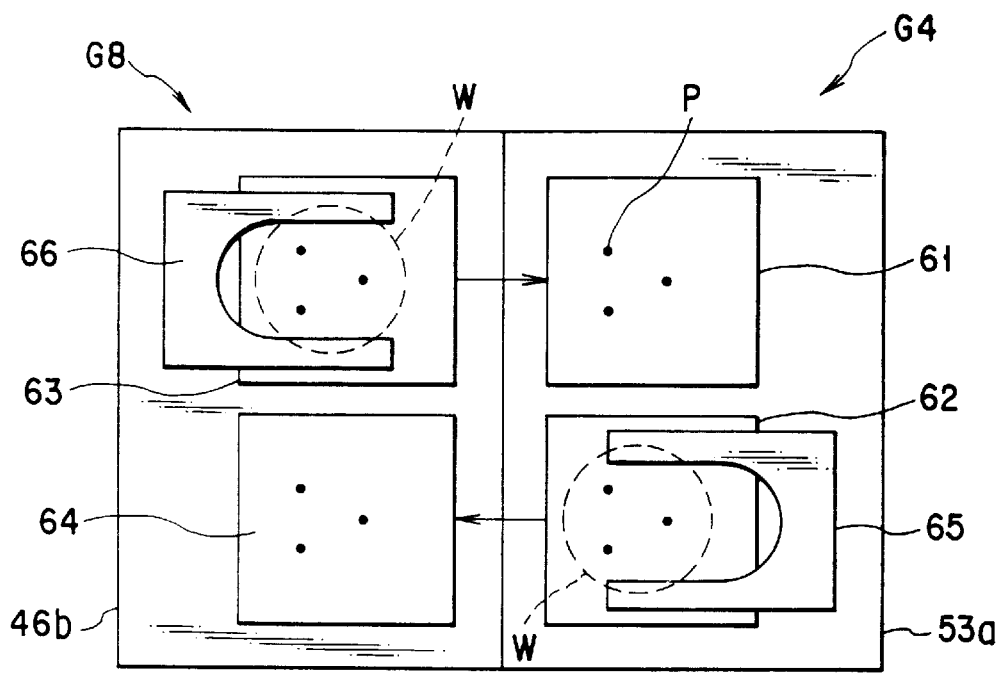
F I G. 4
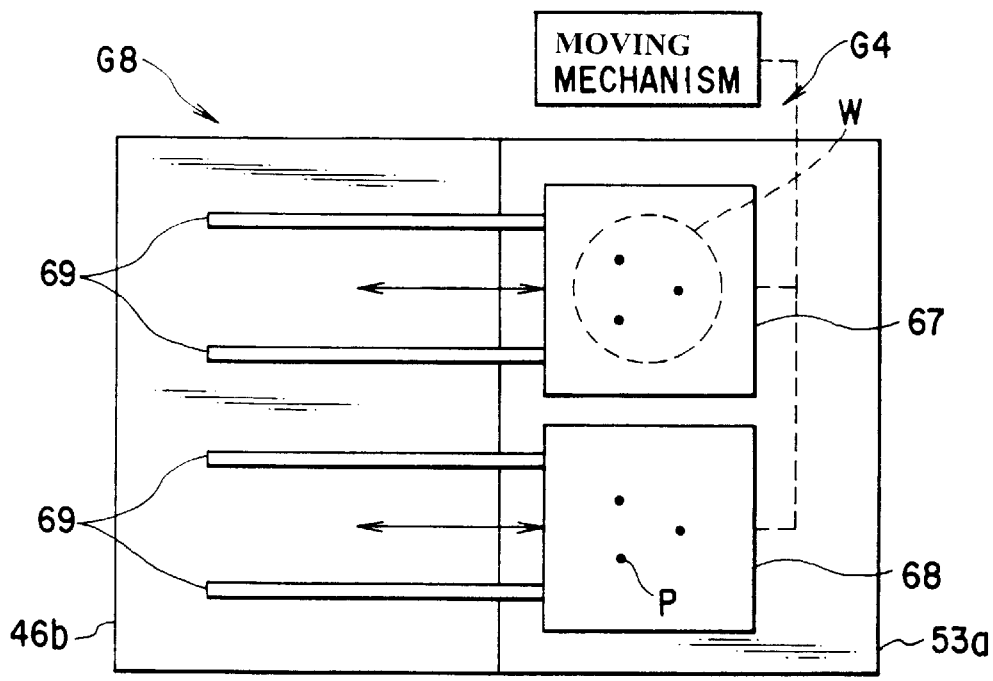
F I G. 5

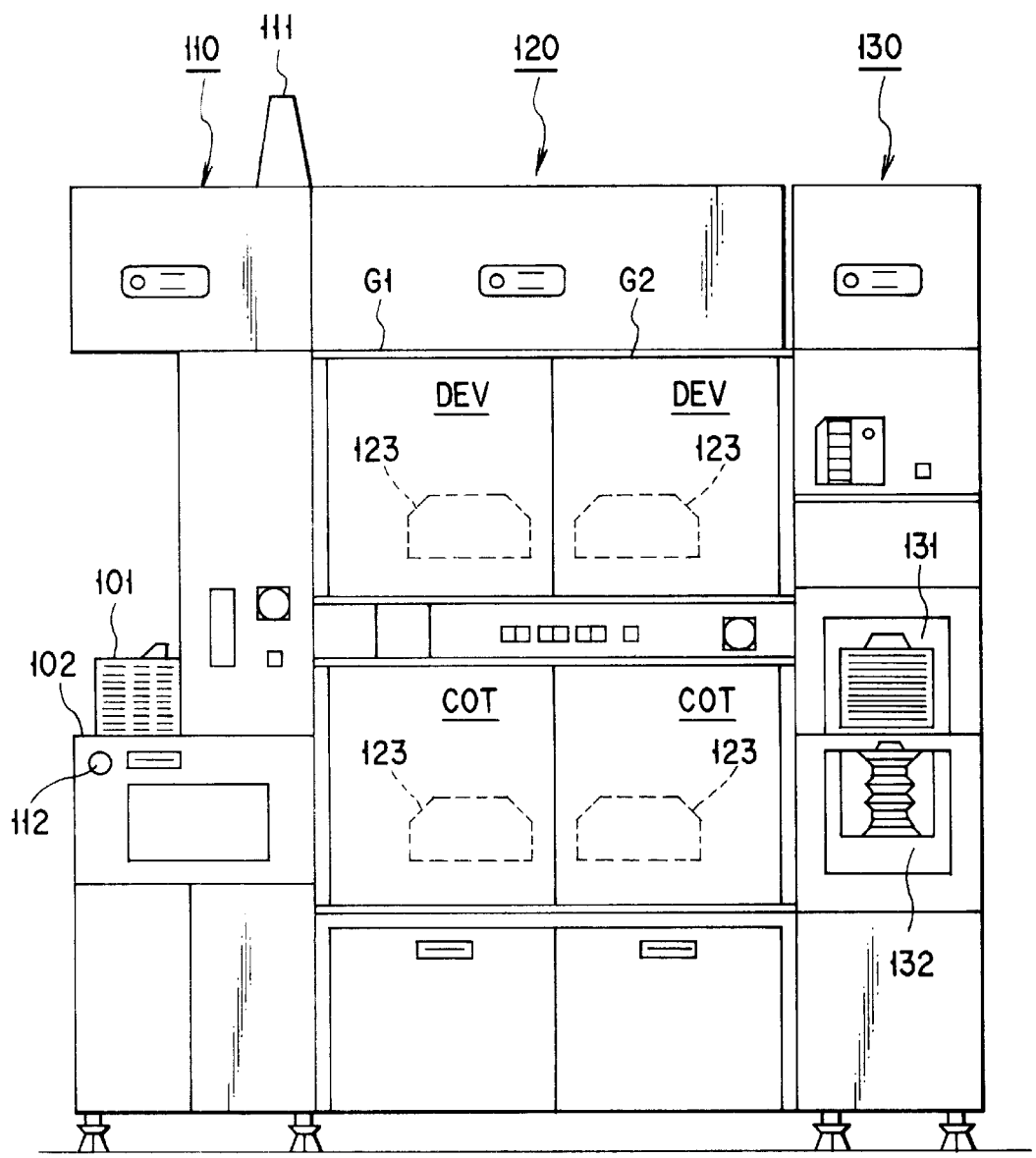
F I G. 9

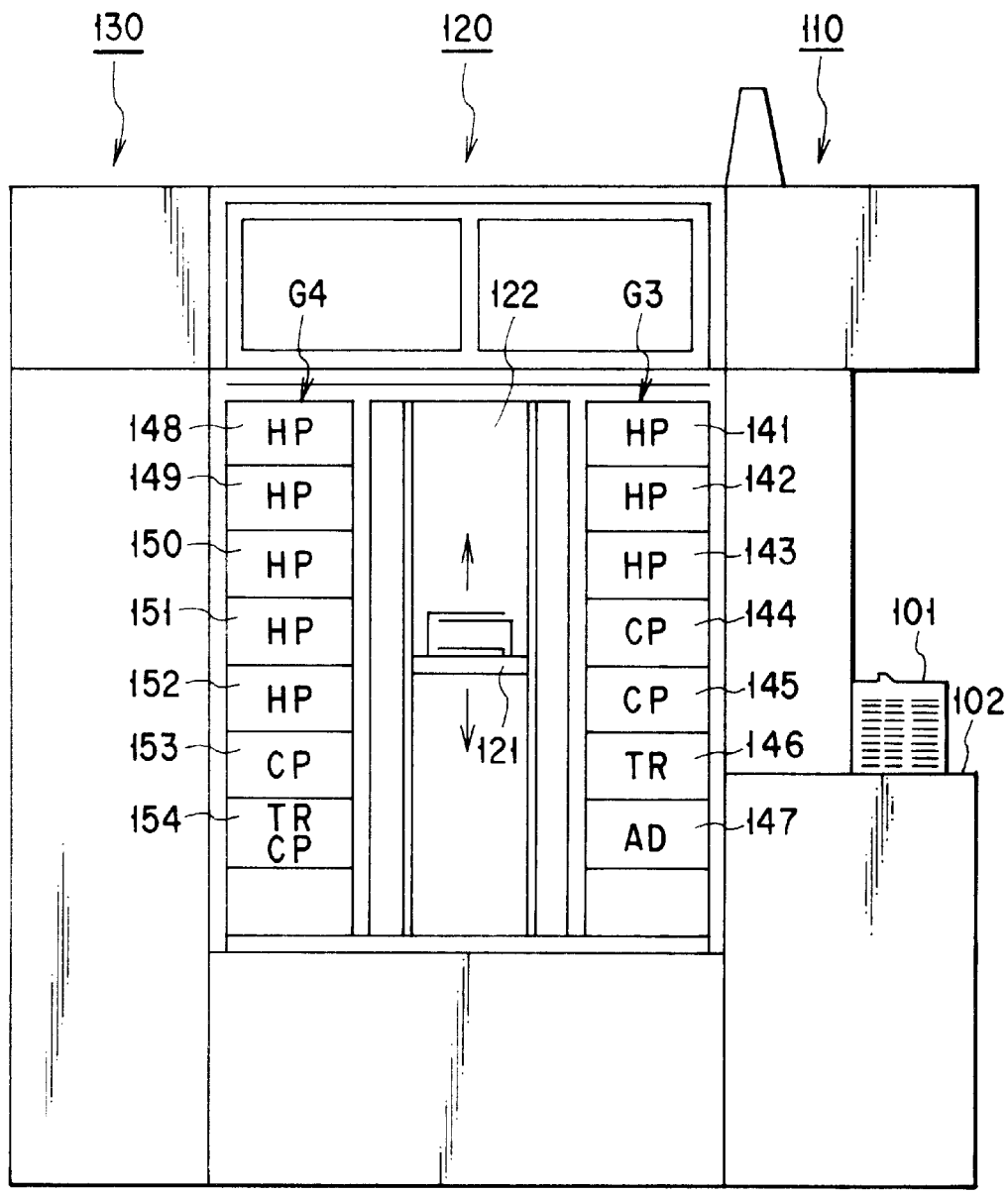
F I G. 10

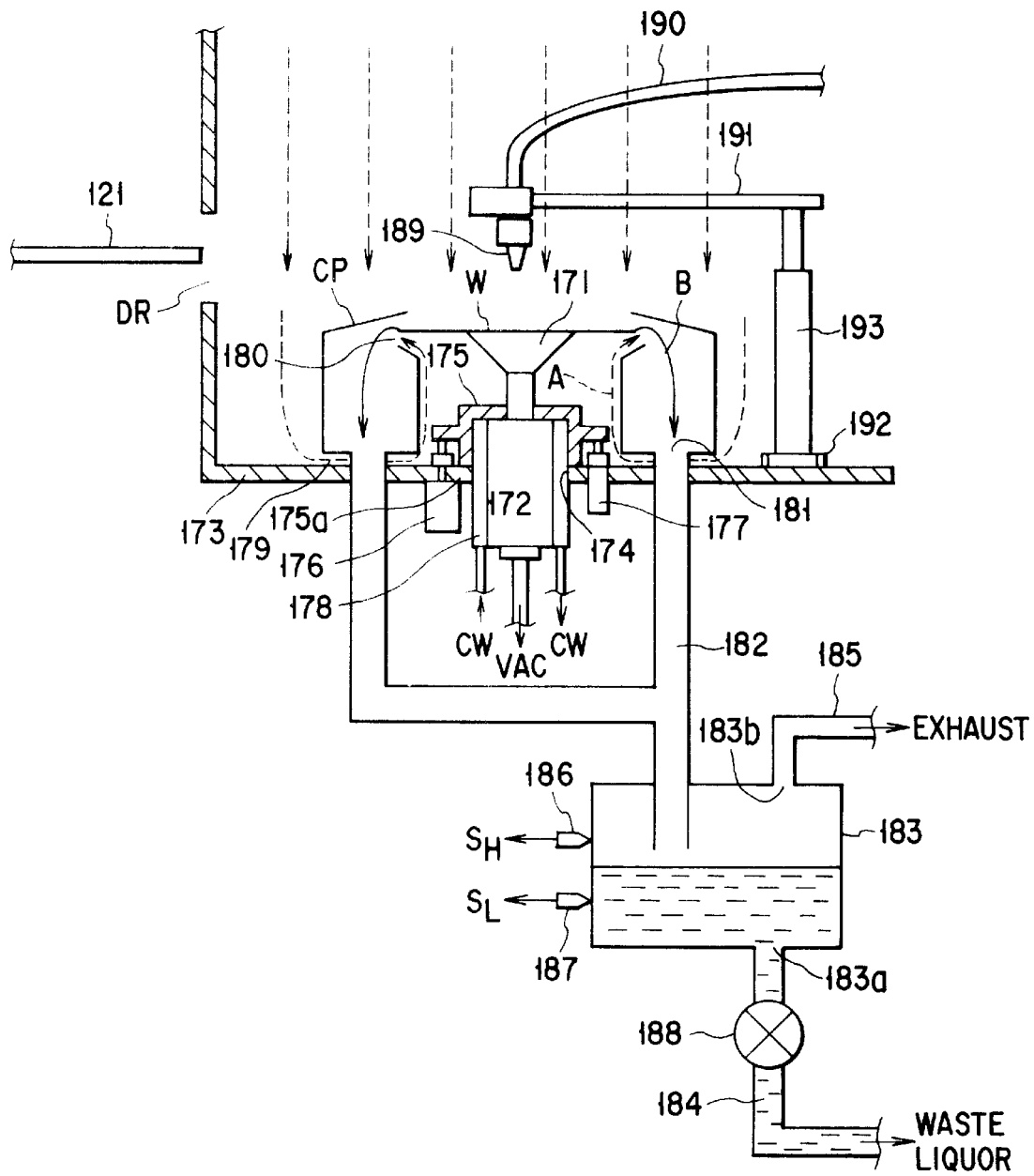
F I G. 13

PROCESSING APPARATUS

BACKGROUND OF THE INVENTION

This invention relates to a processing apparatus for performing processes, including a coating process and a developing process, on an object, such as a semiconductor wafer or an LCD (Liquid-Crystal Device) substrate.

The semiconductor device manufacturing processes include a series of steps including coating a semiconductor wafer, usually a silicon substrate, with a treatment solution, such as a photo photoresist solution, exposing the photo photoresist film with a reduced circuit pattern using photolithography, and developing the resulting photo photoresist film.

A processing system that effects such coating and development comprises a cassette station that picks out a semiconductor wafer from a cassette and brings it into the cassette, a cleaning unit that cleans the wafer, an adhesion unit that performs an adhesion process on the surface of the wafer, a cooling unit that cools the wafer to a specific temperature, a photoresist coating unit that coats the surface of the wafer with a photoresist solution, a baking unit that effects pre-baking and post-baking, that is, heats the wafer before and after coating the wafer with the photoresist solution periphery exposure unit that facilitates the removal of the photoresist from the periphery of the wafer, a wafer delivery table that is used to deliver the wafer to the adjacent exposure unit, and a developing unit that exposes the exposed wafer to a developing solution and thereby selectively dissolving the photoresist on the wafer into the developing solution. The processing unit is an integration of these component parts, which improves the working efficiency.

In a widely-used conventional processing system of this type, a wafer transport path is laid longitudinally in the center of the system, a plurality of units are provided on both sides of the transport path, with each unit facing the front, and a wafer carriage for carrying the wafer to each unit is allowed to move over the wafer transport path.

Because the individual processing units are arranged along the wafer transport path extending horizontally, the processing system is oblong. The system layout makes the space occupied by the entire system larger, resulting in an increase in the cost of the clean room. Particularly to increase the cleanness in the entire system or at each section by applying a vertical laminar flow to this type of processing system, the large space makes the initial cost and maintenance cost of the air conditioners or filters very high.

To overcome this problem, a processing system has been proposed where a wafer transport member is able to move vertically and rotate around the vertical axis and processing units are arranged. around the wafer transport member in multiple stages, as described in the Jpn. Pat. Appln. KOKAI Publication No. 4-85812. With such a processing system, the space occupied by the system is decreased, which reduces the cost of the clean room and speeds up the transport speed and access speed, improving the throughput.

In the processing system, there is a limit to the number of stacked units because of restrictions on the height of the clean room. Since there have been demands for a further improvement in the through-put, the processing system seems to have difficulty meeting the demands sufficiently. There has been another demand for the diversification of processing.

In a composite processing system that has various processing units in a single system, a photoresist coating process and a developing process are carried out independently in separate processing units. In the processing units, the waste liquor after the processing and the solvent atmosphere containing organic solvent in the processing chamber are directed out of the composite processing system through a waste liquor pipe and an exhaust pipe. The directed waste liquor and solvent atmosphere are collected into a waste liquor tank and exhaust tank through a waste liquor pipe and an exhaust pipe laid in the factory.

With the system constructed as described above, for example, should a fire break out in the factory, there is a fear that the fire will pass through the exhaust pipe filled with the solvent atmosphere and spread into the composite processing system. Moreover, should a fire start in the composite processing system, there is a possibility that the fire will pass through the exhaust pipe and spread throughout the factory.

BRIEF SUMMARY OF THE INVENTION

An object of the present invention is to provide a processing apparatus capable of performing highly diversified processes with a very high throughput.

Another object of the present invention is to provide a processing apparatus capable of preventing not only a fire outside the apparatus from spreading into the apparatus through an exhaust path, but also a fire inside the apparatus from spreading throughout the factory.

According to a first aspect of the present invention, there is provided a processing apparatus comprising: a plurality of processing sets, each set including a transport path extending vertically, a plurality of processing sections provided around the transport path and each having a plurality of processing units laid one on top of another vertically, each of the processing units performing a specific process on objects, and a main transport mechanism that moves the transport path and brings the objects into and carries the objects out of each processing unit in the plurality of processing sections; and an inter-set transport mechanism for transporting objects between the adjacent processing sets.

With a processing apparatus having the above configuration, the number of processing units can be made much larger. This improves the throughput remarkably and enhances the diversity of processing.

In this case, it is desirable that each of the adjacent processing sets should have at least one processing section having a transfer unit, that the processing sections having the transport units should be arranged side by side, and that the inter-set transport mechanism should transport a substrate via the transport units in the adjacent processing sections. This speeds up the transport of objects between the processing sets and improves the throughput more. Furthermore, it is desirable that the transport units in the adjacent processing sections should be positioned at the same height. This facilitates the transport of objects between the adjacent processing sets.

According to a second aspect of the present invention, there is provided a processing apparatus comprising: a plurality of processing sets, each set including a transport path extending vertically, at least one first processing section composed of a plurality of processing units that are provided around the transport path and include photoresist coating units for coating objects with photoresist and/or developing units for developing a pattern of photoresist, a second processing section composed of a plurality of processing units which are laid one on top of another vertically and include a heating unit for heating objects, a cooling unit for cooling objects, and a transport unit for transporting objects, and a main transport mechanism that moves the transport path and brings the objects into and carries the objects out of each processing unit in the first and second processing sections; and an inter-set transport mechanism for transporting objects between the adjacent processing sets, wherein the adjacent processing sets are arranged side by side so that the second processing sections may be adjacent to each other, and the inter-set transport mechanism transports objects via the transport units in the adjacent second processing sections.

According to a third aspect of the present invention, there is provided a processing apparatus comprising: a processing station for performing a series of processes, including photoresist coating and developing processes, on objects; a transport station for delivering objects to another apparatus and to the processing station; and an interface section for delivering objects to the processing station and to an exposure apparatus, wherein the processing station comprises a plurality of processing sets, each set including a transport path extending vertically, at least one first processing section having a plurality of processing units that are provided around the transport path and include photoresist coating units for coating objects with photoresist and/or developing units for developing a pattern of photoresist, a second processing section having a plurality of processing units that are laid one on top of another vertically and include a heating unit for heating objects, a cooling unit for cooling objects, and a transport unit for transporting objects, and a main transport mechanism which moves the transport path and brings the objects into and carries the objects out of each processing unit in the first and second processing sections; and an inter-set transport mechanism for transporting objects between the adjacent processing sets, the adjacent processing sets being arranged side by side so that the second processing sections may be adjacent to each other, and the inter-set transport mechanism transports objects via the transport units in the adjacent second processing sections.

The processing apparatus according to each of the second and third aspects of the invention is a more concrete version of the invention obtained by applying the processing apparatus according to the first aspect to a photoresist coating and developing system. The configuration of the processing apparatus according to each of the second and third aspects realizes a photoresist coating and developing process with a very high throughput.

In the processing apparatus according to each of the second and third aspects, it is desirable that at least one of the second processing sections in each processing set should include a heating unit, a cooling unit, and a transport unit, with the heating unit above the transport unit and the cooling unit below the transport unit. With this configuration, thermal interference can be reduced more.

In the processing apparatus according to each of the second and third aspects, it is desirable that at least one of the second processing sections in the processing sets should include a heating unit, a cooling unit, a transfer unit, and an adhesion processing unit for performing an adhesion process on the objects, with the heating unit and cooling unit above the transport unit in that order from the top and the adhesion processing unit below the transport unit. It is also desirable that the second processing section should also include a down flow forming section for forming a down flow in the transport path. With this configuration, while thermal interference is being suppressed as much as possible, HMDS gas in the adhesion processing unit is discharged in the form of a down flow without reaching another processing unit. This eliminates an adverse effect of HMDS gas.

In the processing apparatus according to the third aspect of the invention, it is desirable that the transport station should be provided on one side of the processing station, and the inter-set transport mechanism should transport objects from one processing set adjacent to the transport station to one other processing set adjacent to the one processing set and after, the process has been completed, return the objects from the one other processing set to the one processing set and further to the transport station. With this configuration, it is possible to load and unload objects by means of a single transport station as in the prior art, while realizing highly diversified processes with a high throughput.

In the processing apparatus according to each of the second and third aspects, it is desirable that the transport units in the adjacent second processing sections should be positioned at the same height. This facilitates the transfer of objects between the processing sets.

In the processing apparatus according to each of the first, second, and third aspects, it is desirable that each of the transport units should have two transport boats and use one boat when bringing in objects and the other boat when carrying out objects. In this case, because the objects can be transported, regardless of the timing of bringing in or carrying out the objects, the throughput is improved more.

The inter-set transport mechanism may have a transport arm for transporting objects between one transport unit and another transport unit. Moreover, the inter-set transport mechanism may have moving means that moves objects stage to transport objects between one transport unit and another transport unit. In either case, the objects can be transport rapidly.

In the processing apparatus according to each of the first, second, and third aspects, it is desirable that each of the processing sets should further include a down flow forming section for forming a down flow in the transport path, the down flow forming section including an air intake provided at the top end of the transport path, an exhaust vent provided at the bottom end of the transport path, and a filter mechanism that is provided at the air intake and purifies the taken-in air. The down flow forming section enables the processing in the purified air all the time. This remarkably reduces the possibility that particles will be produced and adhere to the objects, assuring a very clean process.

In the processing apparatus according to each of the first, second, and third aspects, it is desirable that each of the processing sets should further include an atmosphere control section for controlling the atmosphere in the transport path. This makes it possible to carry out the processing in a desired atmosphere all the time, assuring a stable process. In this case, it is desirable that the atmosphere control section should control the atmosphere in the transport path in each of the processing sets independently. This makes it possible to control the atmosphere in each processing set, realizing highly diversified processes.

In a fourth aspect of the present invention, the processing apparatus according to each of the first, second, and third aspects further comprises a processing chamber for treating objects with organic solvent, an exhaust path for discharging the atmosphere in the processing chamber from the apparatus, and a blocking section for blocking the exhaust path in case of emergency.

In a fifth aspect of the present invention, the processing apparatus according to each of the first, second, and third aspects further comprises a processing chamber for treating objects with organic solvent, an exhaust path for discharging the atmosphere in the processing chamber from the apparatus, an input section for inputting a fire sense signal from outside the apparatus, and a blocking section for blocking the exhaust path when receiving the fire sense signal.

In a sixth aspect of the present invention, the processing apparatus according to each of the first, second, and third aspects further comprises a processing chamber for treating objects with organic solvent, an exhaust path for discharging the atmosphere in the processing chamber from the apparatus, a fire sensing section for sensing a fire in the apparatus, and a blocking section for blocking the exhaust path when the fire sensing section has sensed a fire.

In a seventh aspect of the present invention, the processing apparatus according to each of the first, second, and third aspects further comprises a processing chamber for treating objects with organic solvent, an exhaust path for discharging the atmosphere in the processing chamber from the apparatus, an emergency button, and a blocking section for blocking the exhaust path when the emergency button is pressed.

Since the processing apparatus of the fourth aspect blocks the exhaust path filled with an atmosphere of solvent in case of emergency, the exhaust path is shut off from the outside world in case of emergency. For example, this prevents not only a fire from passing through the exhaust path and spreading into the apparatus, but also a fire in the apparatus from spreading throughout the factory.

With the processing apparatus of the fifth aspect, when a fire sense signal is received from outside the apparatus, a fire is prevented from passing through the exhaust path and spreading into the apparatus.

Since the processing apparatus of the sixth aspect blocks the exhaust path when a fire has been sensed in the apparatus, the fire in the apparatus can be prevented from spreading throughout the factory.

With the processing apparatus of the seventh aspect, when the emergency button has been pressed, the exhaust path is blocked. The use of the emergency button is particularly useful when, for example, the fire detectors do not work.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 2 is a side view of the photoresist coating and developing system of FIG. 1;

FIG. 4 shows an example of a mechanism for transporting objects between the processing units which is used in the apparatus of FIG. 1;

FIG. 5 shows another example of a mechanism for transporting objects between the processing units which is used in the apparatus of FIG. 1;

FIG. 9 is a front view of the photoresist coating and developing system of FIG. 8;

FIG. 10 is a rear view of the photoresist coating and developing system of FIG. 8;

FIG. 13 is a sectional view of the photoresist coating unit (COT) and developing unit (DEV) in the photoresist coating and developing system of FIG. 8;

DETAILED DESCRIPTION OF THE INVENTION

Hereinafter, an embodiment where a processing apparatus of the present invention is applied to a photoresist coating and developing system for semiconductor wafers will be explained in detail by reference to FIGS. 1 to 3.

The processing system comprises a cassette station 10 acting as a transport station, a processing station 20 including a plurality of processing units, and an interface station 30 for delivering a wafer W to an exposure apparatus (not shown) adjacent to the processing station 20.

The cassette station 10 loads a plurality of semiconductor wafers W (or objects to be processed) from another system or unloads them out to another system in a state of that, for example, 25 wafers are received in a wafer cassette 1. The cassette station also transports a wafer between the wafer cassette 1 and the processing station 20.

Figure 1:
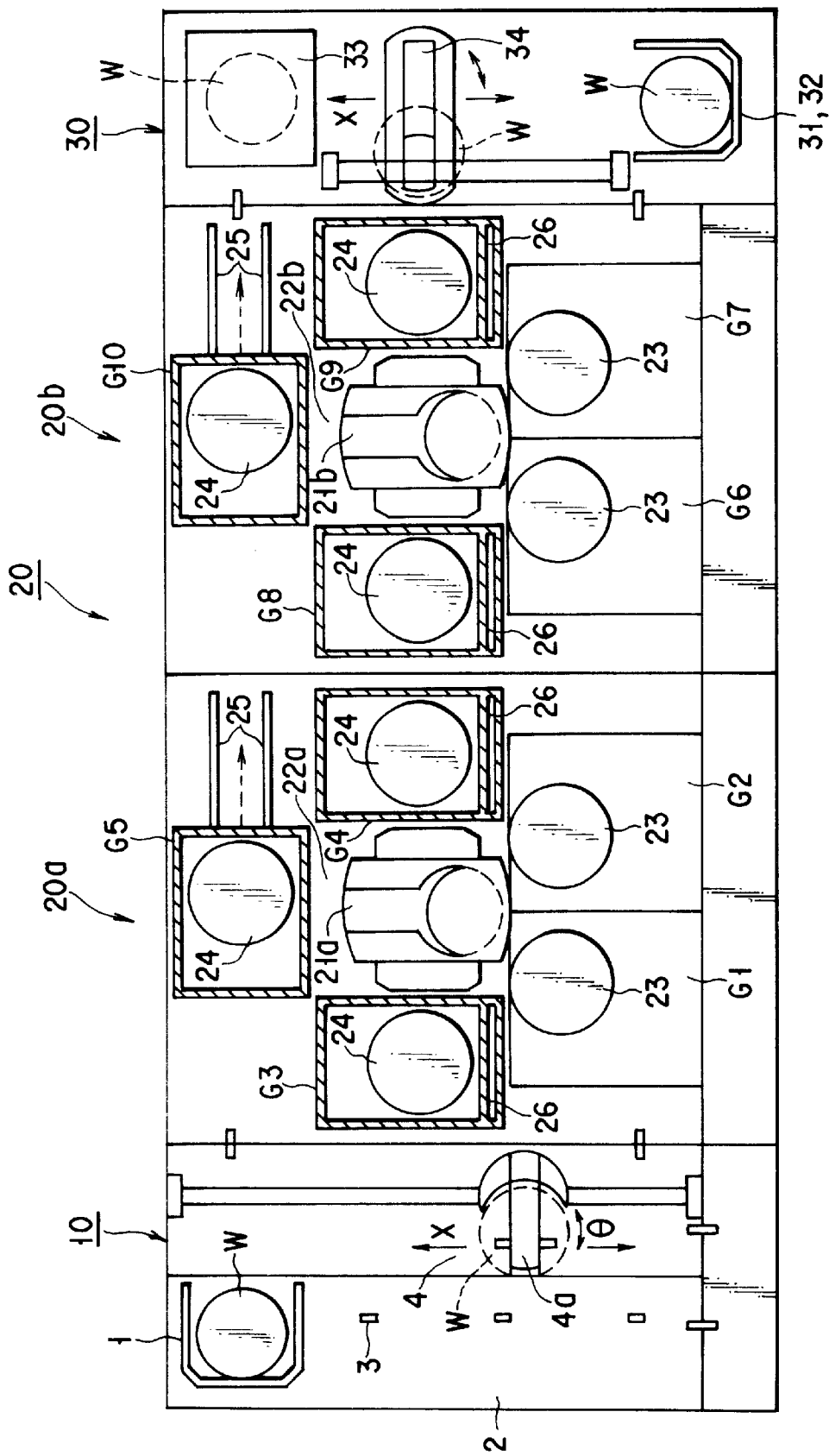
FIG. 1 is a plan view of a photoresist coating and developing system according to an embodiment of a processing apparatus of the present invention.

In the cassette station 10, a plurality of projections 3 (in the figure, four projections) are formed on a cassette table 2 in the direction of X as shown in FIG. 1. Wafer cassette 1 can be arranged in a line at the projections 3, with the wafer inlet and outlet of each wafer cassette facing the processing station 20. In the wafer cassette 1, the wafers W are laid vertically (or in the direction of Z). The cassette station 10 has a wafer transport mechanism 4 between the wafer cassette table 2 and the processing station 20. The wafer transport mechanism 4 has a wafer transport arm 4a which can move in the direction of cassette arrangement (i.e., in the direction of X) and in the direction of wafer arrangement (i.e., in the direction of Z). The wafer transport mechanism can cause the arm 4a to selectively access one of the wafer cassettes 1. The wafer transport arm 4a can also rotate in the direction of θ. The arm 4a is able to carry a wafer W to a transport unit (TR) 46 belonging to group G3 on the side of the processing station 20.

The processing station 20 includes a plurality of processing units for performing a series of processes for coating and developing a semiconductor wafer W. Those units are arranged in specific positions in a multistage manner. The multistage arrangement allows the semiconductor wafers W to be processed one by one. The processing station 20 has two processing sets 20a and 20b as shown in FIG. 1. The processing unit 20a has a transport path 22a in its center. In the transport path, a main wafer transport mechanism 21a able to move vertically is provided. Around the wafer transport path 22a, all the processing units are arranged. Similarly, the processing unit 20b has a transport path 22b in its center. In the transport path, a main wafer transport mechanism 21b able to move vertically is provided. Around the wafer transport path 22b, all the processing units are arranged. Those processing units are divided into a plurality of processing sections. Each processing section includes a plurality of processing units arranged vertically in a multistage manner. In the embodiment, the processing set 20a has five processing sections G1, G2, G3, G4, and G5 arranged around the wafer transport path 22a. Similarly, the processing set 20b has five processing sections G6, G7, G8, G9, and G10 arranged around the wafer transport path 22b. The arrangement of these processing sections make each of the wafer transport paths 22a and 22b an almost closed space.

The processing sections G1, G2, G6, and G7 are arranged in parallel in the front of the system (i.e., in the lower part of FIG. 1). The processing section G3 is arranged adjacent to the cassette station 10. The processing section G9 is put adjacent to the interface section 30. The processing sections G4 and G8 are arranged side by side in the center of the processing station 20. The processing sections G5 and G10 are arranged at the back of the system.

As shown in FIG. 2, in the processing section G1 of the processing set 20a, two spinner-type processing units are arranged vertically. Each of the spinner-type processing units puts a wafer W on a spin chuck (not shown) in a cup 23 and performs a specific process. In the processing section G1, a photoresist coating unit (COT) for coating a wafer W with photoresist and a developing unit (DEV) for developing the pattern of photoresist are laid one on top of the other in that order from the bottom. Similarly, in the processing section G2, a photoresist coating unit (COT) for coating a wafer W with photoresist and a developing unit (DEV) for developing the pattern of photoresist are laid one on top of the other in that order from the bottom. The coating unit and developing unit serve as two spinner-type processing units. The processing sections G6 and G7 in the processing set 20b have the same arrangement of parts.

The reason why the photoresist coating unit (COT) is placed at the lower stage is that the waste photoresist solution is essentially more complex than the waste developing solution in terms of structure and maintenance and that the arrangement of the coating unit (COT) at the lower stage alleviates the complexity. The photoresist coating unit (COT), however, may be placed at the upper stage as the need arises.

Figure 3:
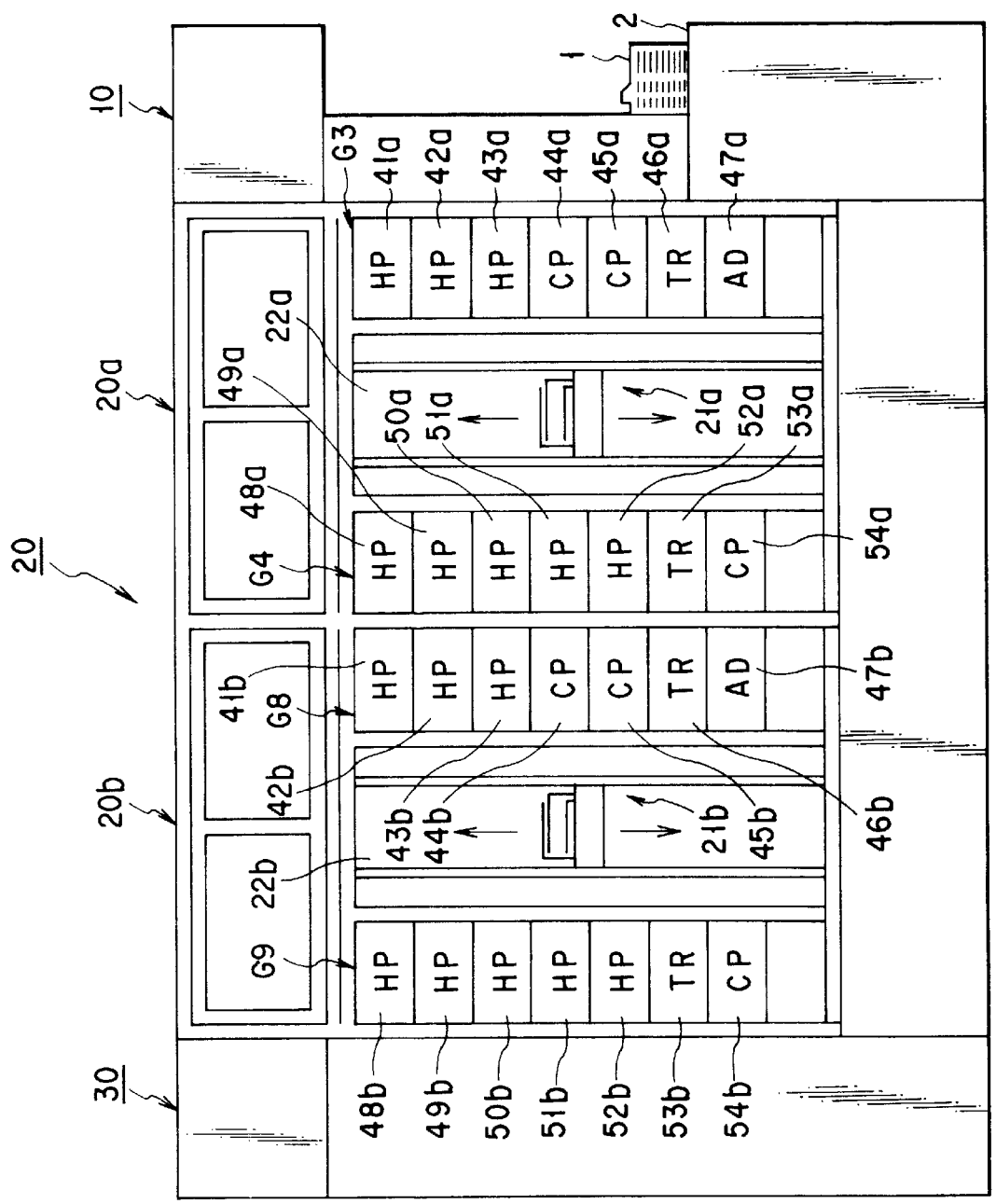
FIG. 3 is a rear view of the photoresist coating and developing system of FIG. 1.

In the processing section G3 of the processing set 20a, open-type processing units and a transfer unit are laid one on top of another in seven stages as shown in FIG. 3 These units perform specific processes on the wafer W on the table 24 (see FIG. 1). Specifically, an adhesion processing unit (AD) 47a, a transport unit (TR) 46a, two chill plate units (CP) 44a and 45a, and three hot plate units (HP) 43a, 42a, and 41a are laid one on top of another in that order from the bottom.

The hot plate units (HP) 41a, 42a, and 43a perform a heating process, such as a pre-baking process or a post-baking process, on a semiconductor wafer W. The chill plate units (CP) 44a and 45a chill the semiconductor wafer W heated by the heating process. The transfer unit (TR) 46a transfers the semiconductor wafer W between the cassette station 10 and the processing set 20a. The adhesion processing unit (AD) 47a performs an adhesion process on the semiconductor wafer W.

Similarly, in the processing section G4, open-type processing units and a transfer unit are laid one on top of another in seven stages as shown in FIG. 3. Specifically, a chill plate unit (CP) 54a, a transport unit (TR) 53a, five hot plate units (HP) 52a, 51a, 50a, 49a, and 48a are laid one on top of another in that order from the bottom. The processing unit G8 in the processing set 20b has the same configuration as that of the processing unit G3. Specifically, an adhesion processing unit (AD) 47b, a transport unit (TR) 46b, two chill plate units (CP) 44b and 45b, and three hot plate units (HP) 43b, 42b, and 41b are laid one on top of another in that order from the bottom.

The processing section G9 has the same configuration of that of the processing section G4. Specifically, a chill plate unit (CP) 54b, a transport unit (TR) 53b, five hot plate units (HP) 52b, 51b, 50b, 49b, and 48b are laid one on top of another in that order from the bottom. The transport unit 53a in the processing section G4 and the transport unit 53b in the processing section G9 are each provided with a chill plate and can chill a semiconductor wafer W.

As described above, the processing section G4 in the processing set 20a is located side by side with the processing section G8 in the processing set 20b. A semiconductor wafer W can be transported between the processing set 20a and the processing unit 20b with an inter-set transport mechanism explained later via the transport unit 53a in the processing section G4 and the transport unit 46b in the processing section G8. In this case, both of the transport units 53a and 46b are located at the same height. This allows the semiconductor wafer W to be transported between these processing sets very easily and smoothly.

The processing sections G5 and G10 at the back of the main wafer transport mechanism 21 has basically the same configuration of that of the processing sections G3, G4, G8, and G9. That is, they each have open-type processing units laid one on top of another in a multistage manner. The processing sections G5 and G10 can move along a guide rail 25 to one side viewed from the main wafer transport mechanism 21. As a result, sliding the processing sections G5 and G10 to one side secures a space, which facilitates the maintenance of the main wafer transport mechanisms 21a and 21b from behind the processing sets.

The interface section 30 is as long as the processing station 20 in the direction of X. As shown in FIGS. 1 and 2, on the front of the interface section 30, a portable pickup cassette 31 and a stationary buffer cassette 32 are laid one on top of the other. At the back of the interface section, a periphery exposure apparatus 33 is provided. A wafer transport arm 34 is provided in the center of the interface section. The wafer transport arm 34 is designed to move in the direction of X and the direction Z and can transport a wafer to both of the cassettes 31 and 32 and to the periphery exposure apparatus 33. The wafer transport arm 34 is also designed to rotate in the direction of θ and can also transfer the wafer W to the transfer unit 53b belonging to the processing section G9 in the processing set 20b of the processing station 20 and to the wafer delivery table (not shown) on the adjacent exposure apparatus's side.

The transport of the wafer between the processing set 20a and the processing set 20b is carried out via the transport unit 53a in the processing section G4 and the transport unit 46b in the processing section G8 as described above. The inter-set transport mechanism used at that time will be explained. As shown in FIG. 4, the transport unit 53a in the processing section G4 has two transport boats and two stages 61 and 62 corresponding to the boats. Similarly, the transport unit 46b in the processing section G8 has two transport boats and two stages 63 and 64 corresponding to the boats. In the figure, P represents a pin for semiconductor wafer transport.

The inter-set transport mechanism has two transport arms 65 and 66. The transport arm 65 transports the semiconductor wafer W from the stage 62 of the transport unit 53a to the stage 64 of the transport unit 46b. The transport arm 66 transports the semiconductor wafer from the stage 63 of the transport unit 46b to the stage 61 of the transport unit 53a.

As described above, because each transport unit has two transport boats and the stages corresponding to the boats, it can switch the transport route at the time of loading or unloading the wafer and transport the wafer, regardless of the timing with which the wafer is loaded or unloaded. This makes it possible to transport the wafer rapidly and improve the throughput more. Use of a chill plate for the stage 62 enables the semiconductor wafer W to be chilled at the same time.

Not only the configuration of FIG. 4 but also the configuration of FIG. 5 may be used for the present invention. The configuration of FIG. 5 is the same as that of FIG. 4 in that each of the transport units 53a and 46b has two transport boats. The former differs from the latter in that these transport units share common stages 67 and 68.

In this case, the inter-set transport mechanism includes a moving mechanism (not shown) that moves the stages 67 and 68 independently and a rail 69 that guides these stages. The semiconductor wafer W brought into the transport unit 53a is put on the stage 68. The wafer W together with the stage 68 is guided over the rail 69 and transported to the transport unit 46b. Then, the semiconductor wafer W loaded into the transport unit 46b is put on the stage 67. The wafer W together with the stage 67 is guided over the rail 69 and transported to the transport unit 53a.

Figure 6:
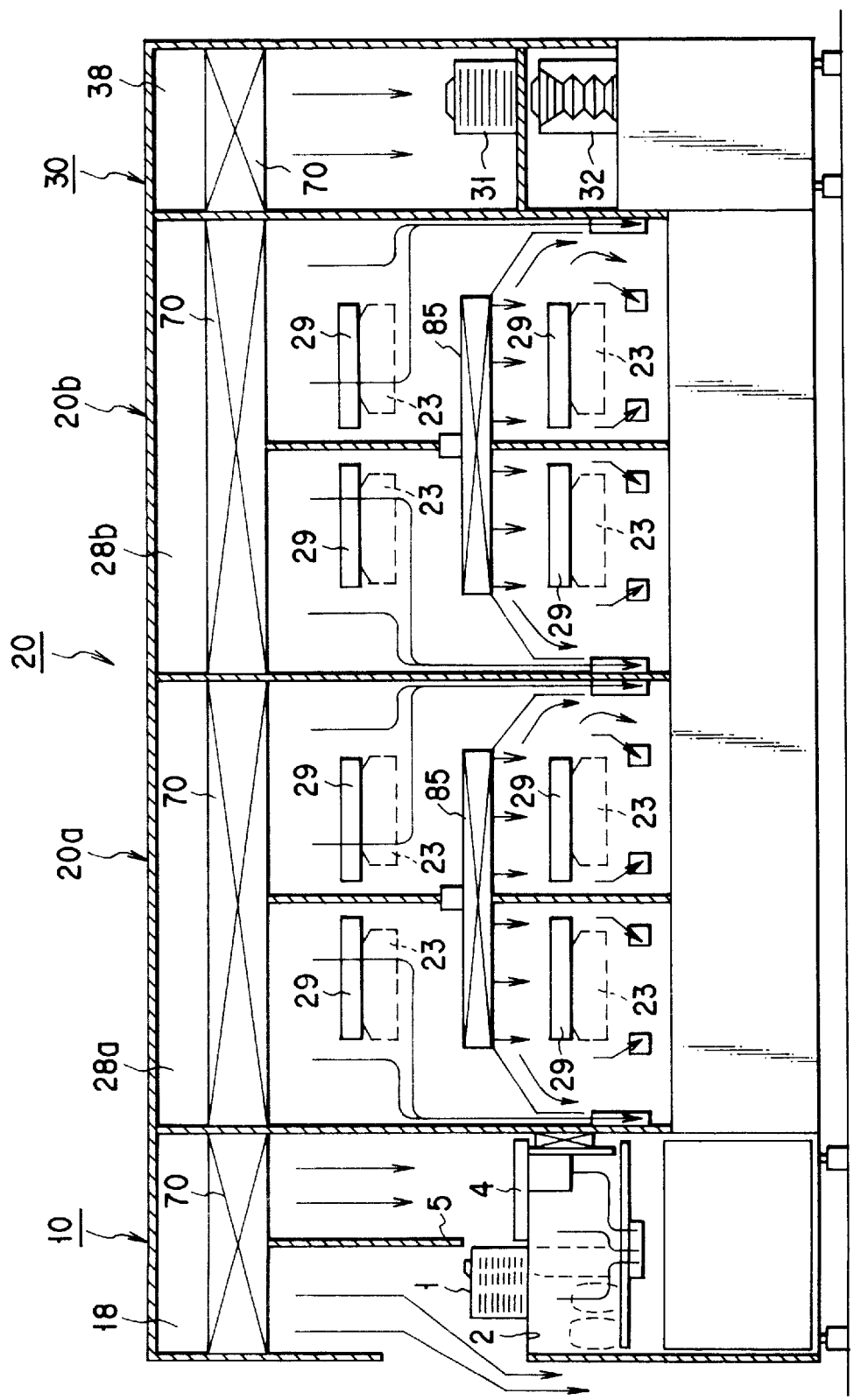
FIG. 6 is a schematic diagram of the flow of clean area in the photoresist coating and developing system of FIG. 1.
Figure 7:
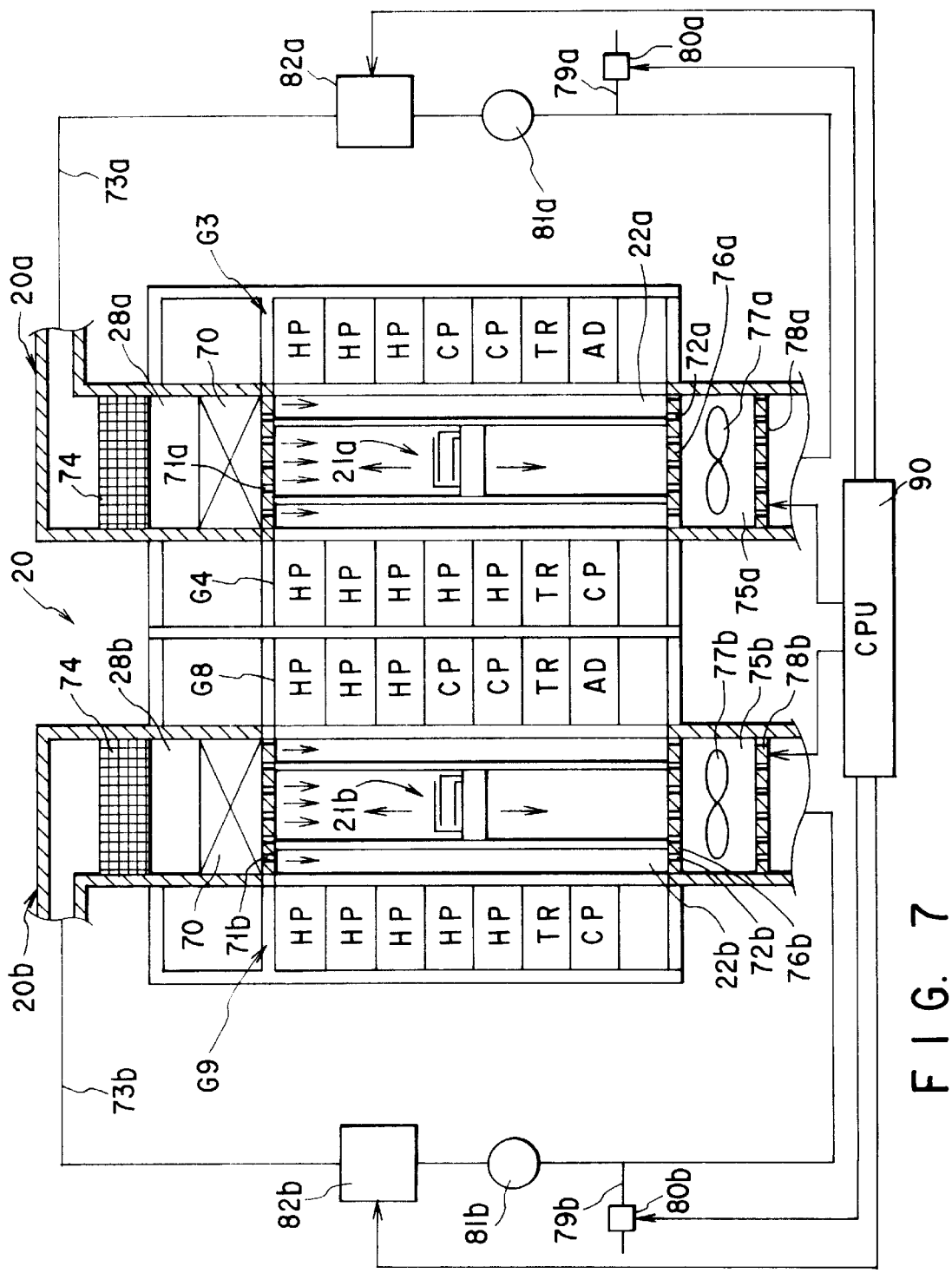
FIG. 7 is a schematic diagram of the atmosphere control system in the photoresist coating and developing system of FIG. 1.

The processing system constructed as described above is installed in a clean room and increases the cleanness of the room. Additionally, in the system, the efficient supply of vertical laminar flow enhances the cleanness in various sections of the clean room. FIGS. 6 and 7 show the flow of clean air in the system and an atmosphere control mechanism.

As shown in FIG. 6, air chambers 18, 28a, 28b, and 38 are provided in the upper part of the cassette station 10, the processing sets 20a and 20b in the processing station 20, and the interface section 30. On the bottom surface of each of the air chambers 18, 28a, 28b, and 38, a dust-proof filter 70, such as a ULPA (Ultra Low Penetrate Air) filter 70 is provided. Air is directed into the air chambers 18 and 38 via pipes explained later. These air chambers supply a down flow of clean air through the ULPA filter 70 to the cassette station 10 and the interface section 30. As will be explained later, air is directed into the air chambers 28a and 28b in the same manner. These air chambers supply a down flow of clean air through the filter 70 to the processing section 20.

As shown in FIG. 7, an air inlet 71a for supplying air is provided in the upper part of the wafer transport path 22a in the processing sets 20a. In the lower part of the wafer transport path, an air outlet 72a for discharging the air supplied to the wafer transport path 22a is provided. Similarly, an air inlet 71b is provided in the upper part of the wafer transport path 22b in the processing sets 20b. In the lower part of the wafer transport path, an air outlet 72b for discharging the air supplied to the wafer transport path 22b is provided. The air chamber 28a is provided on the junction of the air inlet 71a and the air supply side of a pipe 73a. The air chamber 28b is provided on the junction of the air inlet 71b and the air supply side of a pipe 73b. On the bottom surface of each of these junctions, the ULPA filter 70 is provided. In the upper part of the junction, a chemical filter 74 is provide which has the function of removing organic contaminants, such as amine.

In the junction of the air outlet 72a and the exhaust side of the pipe 73a, an exhaust chamber 75a is provided. On the top surface of the exhaust chamber 75a, a porous plate 76a in which an air outlet 72a is made is provided. In the exhaust chamber 75a, an exhaust fan 77a is provided. In the junction of the exhaust chamber 75a and the pipe 73a, a pressure regulator, for example, a slit damper 78a, is provided. Similarly, in the junction of the air outlet 72b and the exhaust side of the pipe 73b, an exhaust chamber 75b is provided. On the top surface of the exhaust chamber 75b, a porous plate 76b in which an air outlet 72b is made is provided. In the exhaust chamber 75b, an exhaust fan 77b is provided. In the junction of the exhaust chamber 75b and the pipe 73b, a pressure regulator, for example, a slit damper 78b, is provided.

Each of the slit dampers 78a and 78b has a fixed porous plate with a large number of air vents and a movable porous plate that is provided so as to reciprocate horizontally over the fixed porous plate and has as many regulation vents as there are air vents in the fixed porous plate. When the movable porous plate is reciprocated horizontally by a suitable reciprocating driver, such as a cylinder mechanism or a timing belt mechanism, this regulates the area of the opening to adjust the amount of ventilation, thereby adjusting the pressure in each of the wafer transport spaces 22a and 22b. For example, the pressure in the wafer transport space can be set positive with respect to the pressure in the clean room. While in the embodiment, the slit damper is used as the pressure regulator, the pressure regulator is not necessarily limited to a slit damper. The pressure regulator may be any suitable device other than a slit damper, provided that the device can adjust the area through which the air discharged from the transport paths 22a and 22b passes.

The pipes 73a and 73b form a circulatory path. In the middle of the pipes 73a and 73b, fans 81a and 81b are provided, respectively. These fans form a down flow in the transport paths 22a and 22b. In the pipe 73a, an outside air inhalation pipe 79a for inhaling outside air is provided between the fan 81a and slit damper 78a. On the outside air inhalation pipe 79a, an air-flow regulating mechanism 80a is provided. Similarly, in the pipe 73b, an outside air inhalation pipe 79b is provided between the fan 81b and slit damper 78b. On the outside air inhalation pipe 79b, an air-flow regulating mechanism 80b is provided. When the fans 81a and 81b are driven and the dampers 80a and 80b are opened at a specific index, the outside air, or the clean air in the clean room, is supplied from the outside air inhalation pipes 79a and 97b through the pipes 73a and 73b to the transport paths 22a and 22b, respectively. As a result, even if the clean air supplied to the transport paths 22a and 22b flows into the individual processing units and loses part of it, the air flow of clean air constantly flowing through the transport paths 22a and 22b can be maintained at a constant level by supplying as much air flow as the lost clean air from the air inlets 79a and 79b. Instead of the dampers, another air-flow regulating mechanism, such as an air-flow regulating valve, may be used.

A temperature controller 82a for controlling the temperature of the clean air supplied to the transport path 22a intervenes between the fan 81a and the air supply chamber 28a in the circulatory pipe 73a. Similarly, a temperature controller 82b for controlling the temperature of the clean air supplied to the transport path 22b intervenes between the fan 81b and the air supply chamber 28b in the circulatory pipe 73b. Although not shown, the insertion of suitable humidity regulating devices in the pipes 73a and 73b enables the humidity in the transport paths 22a and 22b to be controlled.

The slit dampers 78a and 78b, the dampers 80a and 80b, and the temperature controllers 82a and 82b, which are constructed as described above, are controlled by the control signal from a central processing unit (CPU) 90 serving as a controller. Specifically, the signal sensed by a pressure/airflow sensor (not shown) provided on the air inlet side of each of the transport paths 22a and 22b is transmitted to the CPU 90. The CPU 90 compares the sensed signal with the information previously stored in the CPU 90 and produces a control signal. The control signal is transmitted to the slit dampers 78a and 78b and dampers 80a and 80b, thereby controlling the pressure in the transport paths 22a and 22b and the flow of the supplied clean air to specific values.

The temperature signal sensed by a temperature sensor (not shown) put in the lower part of each of the transport paths 22a and 22b is transmitted to the CPU 90. The CPU 90 compares the temperature signal with the information previously stored in the CPU 90 and produces a control signal. The control signal is transmitted to the temperature controllers 82a and 82b, thereby controlling the clean air flowing through the pipes 73a and 73b to a specific temperature, for example, to 23° C. The clean air of 23° C. is supplied to the transport paths 22a and 22b. As a result, the atmosphere in the transport paths 22a and 22b, that is, the pressure, air flow, and temperature, can always be controlled to specific values, enabling each process at the processing system to be carried out suitably.

With such an atmosphere control system, the atmosphere in each of the transport paths 22a and 22b can be controlled separately. Consequently, the atmosphere in the transport path 22a can be made different from the atmosphere in the transport path 22b, which realizes highly diversified processes. For example, the pressure in the transport path 22a can be made different from that in the transport path 22b and a processing unit required for higher cleanness can be placed on the higher pressure processing set's side. Furthermore, the setting temperature in the transport path 22a can be made different from that in the transport path 22b and the processing units can be arranged accordingly. Moreover, it is possible to place a coating unit on one processing unit's side and a developing unit on the other processing unit's side and set suitable atmosphere settings for the respective units. In this case, in addition to the ULPA filter, a chemical filter may be provided only on the developing unit's side.

Furthermore, the circulatory supply of clean air to the transport paths 22a and 22b prevents not only the internal air from flowing out of the processing system, or into the clean room, but also particles and organic contaminants produced in the processing system from leaking into the clean room.

In the cassette station 10, the upper space in the cassette table 2 is separated from the moving space in the wafer transport arm 4a with a hanging partition 5 so that a down flow of air may run independently in both of the spaces as shown in FIG. 6.

In the processing station 20, a ULPA filter 85 is provided on the ceiling of the photoresist coating unit (COT) located at the lower stage of each of the processing sections G1, G2, G6, and G7 as shown in FIG. 6. The air supplied from the circulatory pipes 73a and 73b to the transport paths 22a and 22b passes through the ULPA filter 85 and flows into the photoresist coating unit (COT).

As shown in FIG. 6, on each of the sidewalls of the spinner-type processing units (COT) and (DEV) which face the main wafer transport mechanisms 21a and 21b, respectively, an opening section 29 for allowing the wafer W and the transport arm to go in and out is provided. Each opening section 29 is provided with a shutter (not shown) that prevents particles or organic contaminants from each unit from getting into the main wafer transport mechanism.

In the processing section G3 of the processing set 20a and the processing section G8 of the processing set 20b, the adhesion processing units 47a and 47b for performing an adhesion process on the semiconductor wafers W are provided respectively. These adhesion processing units 47a and 47b use HMDS gas. Because the processing is done in a half open unit, not in a completely sealed unit, the HMDS gas may leak out of the unit. When such a gas enters another open-type processing units, this will have an adverse effect on the semiconductor wafers W.

However, because the adhesion processing units 47a and 47b are provided in the lower part of each of the heating units, cooling units, and transport units as shown in FIG. 3 and a down flow of clean air is formed in the transport paths 22a and 22b, the HMDS gas leaked from the adhesion processing units 47a and 47b flows downward in the form of a down flow and is discharged rapidly so that there is almost no possibility that the gas will enter another processing unit. Therefore, it is possible to prevent the HMDS gas from having an adverse effect on the semiconductor wafer W in another processing unit. Moreover, the intervention of the transport units 46a and 46b between the cooling units 45a and 45b and the adhesion processing units 47a and 47b, respectively, causes thermal interference from be suppressed.

In the processing sections G4 and G9, the hot plate units acting as heating units are placed above the transport units 53a and 53b and the chill plate units acting as cooling units are placed below the transport units 53a and 53b. This arrangement also causes thermal interference to be suppressed.

Next, the processing operation of the entire system will be explained.

In the cassette station 10, the wafer transport arm 4a of the wafer transport mechanism 4 accesses the cassette 1 housing unprocessed wafers W on the cassette table 2 and picks out a single wafer W from the cassette 1. After the alignment of the wafer W, the arm of the main wafer transport mechanism 21a of the processing set 20a in the processing section 20 brings the semiconductor wafer W into the adhesion processing unit 47a belonging to the processing section G3.

After the semiconductor wafer has been subjected to the adhesion process, it is cooled in any one of the chill plate units (CP) and then coated with photoresist by spin coating at the coating unit (COT). Thereafter, pre-baking is done at any one of the hot plate units (HP) and then cooled at any one of the cooling units.

In this case, the inter-set transport mechanism transports the semiconductor wafer W from the processing set 20a to the processing set 20b via the transfer units 53a and 46b with suitable timing. After the specific processes have been completed, the arm of the main transport mechanism 21b transports the semiconductor wafer W to the interface section 30. In the interface section 30, periphery exposure is performed by the periphery exposure apparatus. Thereafter, the semiconductor wafer W is transported to the adjacent exposure apparatus, which performs entire surface exposure.

After the exposure process has been completed, the wafer transport arm 34 of the interface section 30 receives the wafer W and brings the received wafer W into the transport unit 54b belonging to the processing section G9 of the processing set 20b in the processing station 20. The wafer W is cooled by the chill plate in the transport unit 54b. The main wafer transport mechanism 21b receives the wafer W and brings the wafer into any one of the developing units (DEV). The developing unit performs a developing process. After the developing process has been completed, post-baking is done by any one of the hot plate units (HP). Thereafter, the wafer is cooled by any one of the chill plate units (CP).

The inter-set transport mechanism transfers the semiconductor wafers W from the processing set 20b to the processing unit 20a via the transport units 46b and 53a with suitable timing. After the specific processes have been completed, the arm of the main transfer mechanism 21a places the semiconductor wafers W on the table of the transport unit 46a. The arm 4a of the cassette station 10 receives the wafers W and puts them in a specific wafer housing groove of the cassette 1 for housing processed wafers on the cassette table 2. This completes a series of processes.

As described above, because two processing sets are provided and the inter-set transport mechanism transports a semiconductor wafer via the transport units in the processing sections G4 and G8 adjacent to each other, the number of processing units can be made very large, the throughput be improved remarkably, and highly diversified processes be achieved. Furthermore, while realizing highly diversified processes with such a high throughput, objects can be brought in and carried out by a single transport station as in a conventional equivalent.

While in the embodiment, two processing units have been provided, the present invention is not limited to this. Moreover, the object is not limited to a semiconductor wafer. It may be another suitable thing, such as an LCD substrate, a glass substrate, a CD substrate, a photomask, or a printed-circuit board.

As explained above, with the embodiment, there are provided a plurality of processing sets. Each processing set has processing sections arranged around a transport path. Each processing section is composed of a plurality of processing units laid one on top of another. The inter-set transport mechanism transports objects between those processing sets. This configuration not only achieves a very high throughput but also realizes highly diversified processes.

Hereinafter, another embodiment of the present invention, particularly a processing apparatus with an improved exhaust system, will be explained in detail.

Figure 8:
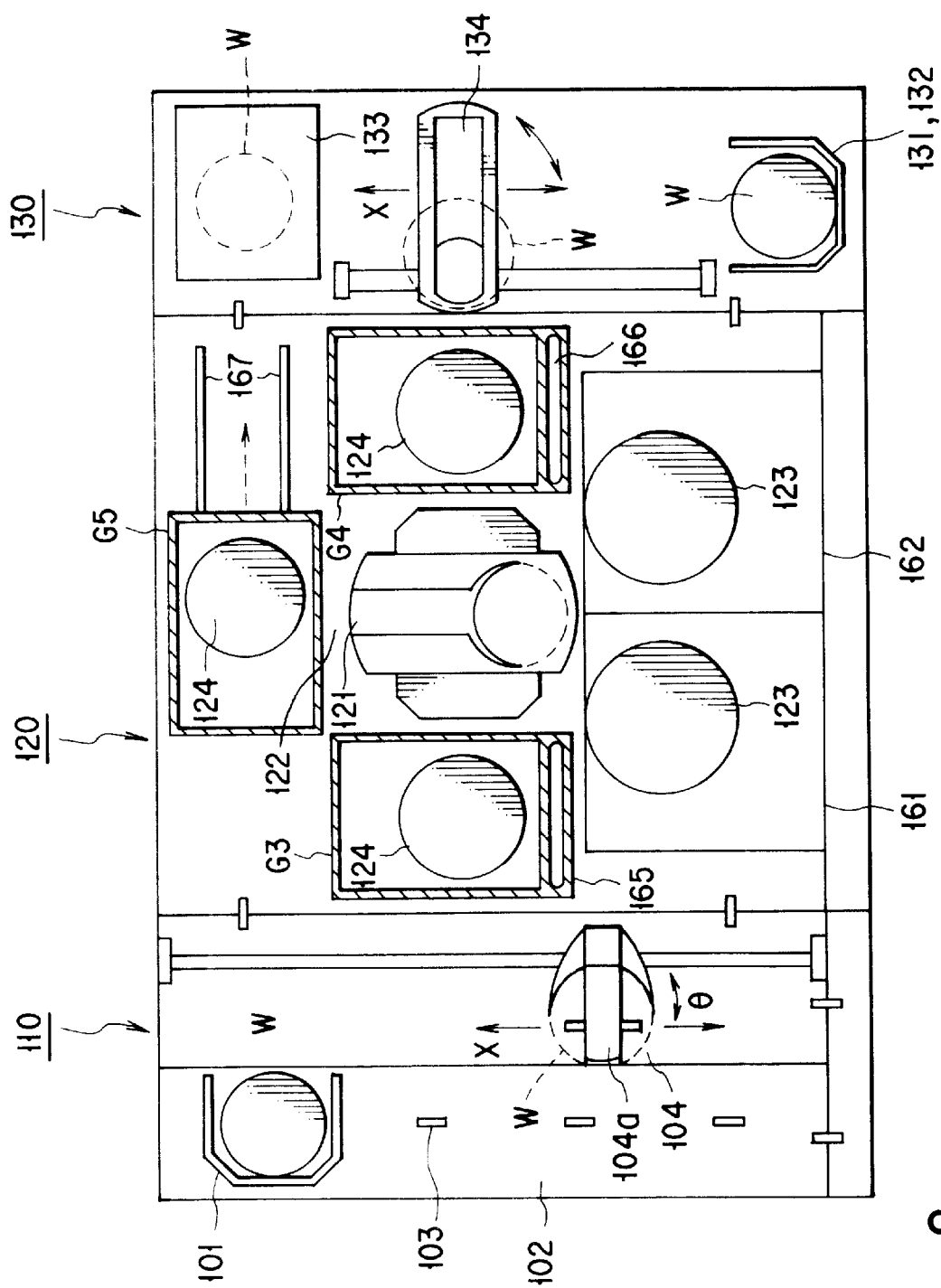
FIG. 8 is a plan view of a photoresist coating and developing system according to another embodiment of a processing apparatus of the present invention.

FIGS. 8 and 9 show a processing system according to the present invention. The processing system corresponds basically to a processing set of the processing system shown in FIGS. 1 and 2. In other words, the processing system includes a cassette station 110, a processing station 120 with a plurality of processing units, and an interface section 130 for delivering a wafer W between the processing station 120 and an exposure apparatus (not shown) adjacent to the processing station 120.

The cassette station 110 brings in a plurality of semiconductor wafers W (i.e., objects to be processed) from another system or carries them out to another system in units of, for example, 25 wafers put in a wafer cassette 101. The cassette station also transports wafer sW between the wafer cassette 101 and the processing station 120. In the cassette station 110, a plurality of projections 103 (in the figure, four projections) are formed on a cassette table 102 in the direction of X as shown in FIG. 8. The wafer cassette 101 can be arranged in a line at the projections 103, with the wafer inlet and outlet of each wafer cassette facing the processing station 120. In the wafer cassette 101, the wafers W are laid vertically (or in the direction of Z). The cassette station 110 includes a wafer transport mechanism 104 between the wafer cassette table 102 and the processing station 120. The wafer transport mechanism 104 has a wafer transport arm 104a that can move in the direction of cassette arrangement (i.e., in the direction of X) and in the direction of wafer arrangement (i.e., in the direction of Z). The wafer transport mechanism can cause the arm 104a to selectively access one of the wafer cassettes 101. The wafer transport arm 104a can also rotate in the direction of θ. The arm 104a is able to carry wafers W to a transport unit (TR) 146 belonging to group G3 on the side of the processing station 120.

The processing station 120 includes a plurality of processing units for performing a series of processes for coating a semiconductor wafer W with a photoresist and developing it. Those units are arranged in specific positions in a multistage manner. The multistage arrangement allows the semiconductor wafers W to be processed one by one. The processing station 120 has a main wafer transport mechanism 121 provided vertically in the center as shown in FIG. 8. All processing units are arranged around a wafer transport path 122 in the main wafer transport mechanism 121. These processing units are divided into processing sections. In each section, a plurality of processing units are arranged vertically in a multistage manner. In the present embodiment, five processing sections G1, G2, G3, G4, and G5 are arranged around the wafer transport path 122 to make the wafer transport path 22 an almost closed space.

The processing sections G1 and G2 are arranged in parallel in the front of the system (in the lower part of FIG. 8). The processing section G3 is placed adjacent to the cassette station 110. The processing section G4 is placed adjacent to the interface section 130. The processing section G5 is placed at the back of the system.

As shown in FIG. 9, in the processing section G1 two spinner-type processing units are arranged vertically. Each of the spinner-type processing units puts a wafer W on a spin chuck (not shown) in a cup 123 and performs a specific process. In the present embodiment, a photoresist coating unit (COT) for coating a wafer W with photoresist and a developing unit (DEV) for developing the pattern of photoresist are laid one on top of the other in that order from the bottom. Similarly, in the processing section G2, a photoresist coating unit (COT) and a developing unit (DEV) are laid one on top of the other in that order from the bottom.

In the processing section G3, open-type processing units for placing wafers W on the table 124 (see FIG. 1) and performing a specific process are laid one on top of another in seven stages as shown in FIG. 10. Specifically, an adhesion processing unit (AD) 147, a transport unit (TR) 146, two chill plate units (CP) 144 and 145, and three hot plate units (HP) 141, 142, and 143 are laid one on top of another in that order from the bottom.

The hot plate units (HP) 141, 142, and 143 perform a heating process, such as a pre-baking process or a post-baking process, on the semiconductor wafers W. The chill plate units (CP) 144 and 145 chill the semiconductor wafers W. The transfer unit (TR) 146 transfers the semiconductor wafers W. The adhesion processing unit (AD) 147 performs an adhesion process on the semiconductor wafer W.

Similarly, in the processing section G4, open-type processing units are laid one on top of another in seven stages as shown in FIG. 10. Specifically, a transport and chill plate unit (TR.CP) 154, a chill plate unit (CP) 153, and five hot plate units (HP) 152, 151, 150, 149, and 148 are laid one on top of another in that order from the bottom.

The processing section G5 at the back of the main wafer transport mechanism 121 has basically the same configuration of that of the processing sections G3 and G4. That is, they each have open-type processing units laid one on top of another in a multistage manner. The processing section G5 can move along a guide rail 167 to one side viewed from the main wafer transport mechanism 121. As a result, sliding the processing section G5 to one side secures a space, which facilitates the maintenance of the main wafer transport mechanism 121 from behind the system.

The interface section 30 is as long as the processing station 120 in the direction of X. As shown in FIGS. 8 and 9, on the front of the interface section 130, a portable pickup cassette 131 and a stationary buffer cassette 132 are laid one on top of the other. At the back of the interface section, a periphery exposure apparatus 133 is provided. A wafer transport arm 134 is provided in the center of the interface section. The wafer transport arm 134 is designed to move in the direction of X and the direction Z and can transport a wafer to both of the cassettes 131 and 132 and to the periphery exposure apparatus 133. The wafer transport arm 134 is also designed to rotate in the direction of θ and can also transfer the wafers W to the transfer and chill plate unit (TR-CP) 154 belonging to the processing section G4 of the processing station 124 and to the wafer delivery table (not shown) on the side of the adjacent exposure apparatus.

As shown in FIG. 9, in the upper part of the cassette station 110, there is provided an alarm lamp 111 that comes on in case of emergency, such as a fire, as explained later. On the front of the cassette station 110, there is provided an emergency button 112 that enables the operator to stop the system in case of emergency, such as a fire, as explained later. The alarm lamp 111 and emergency button 112 may be provided on the processing station 120 or the interface section 130.

Figure 11:
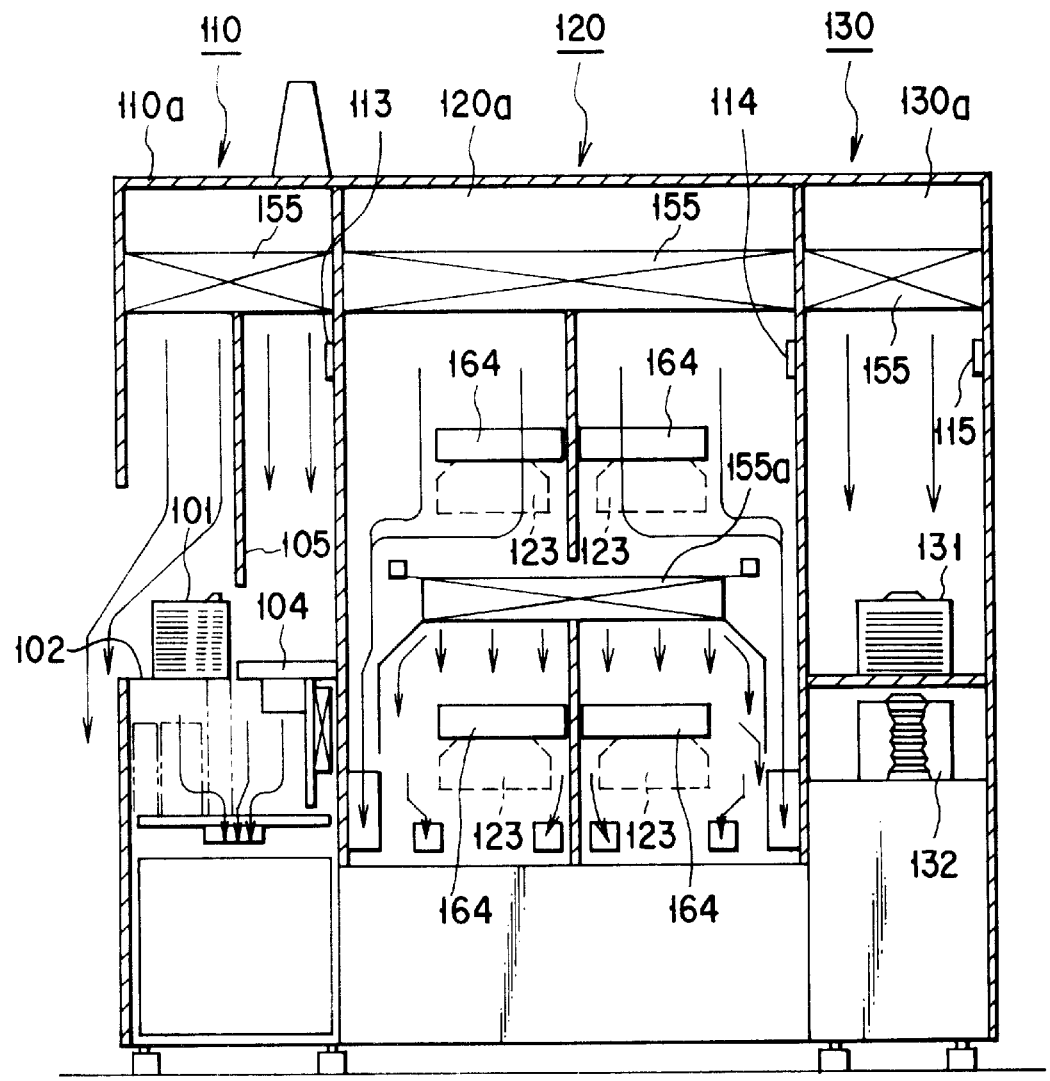
FIG. 11 is a schematic diagram of the flow of clean area in the photoresist coating and developing system of FIG. 8.
Figure 12:
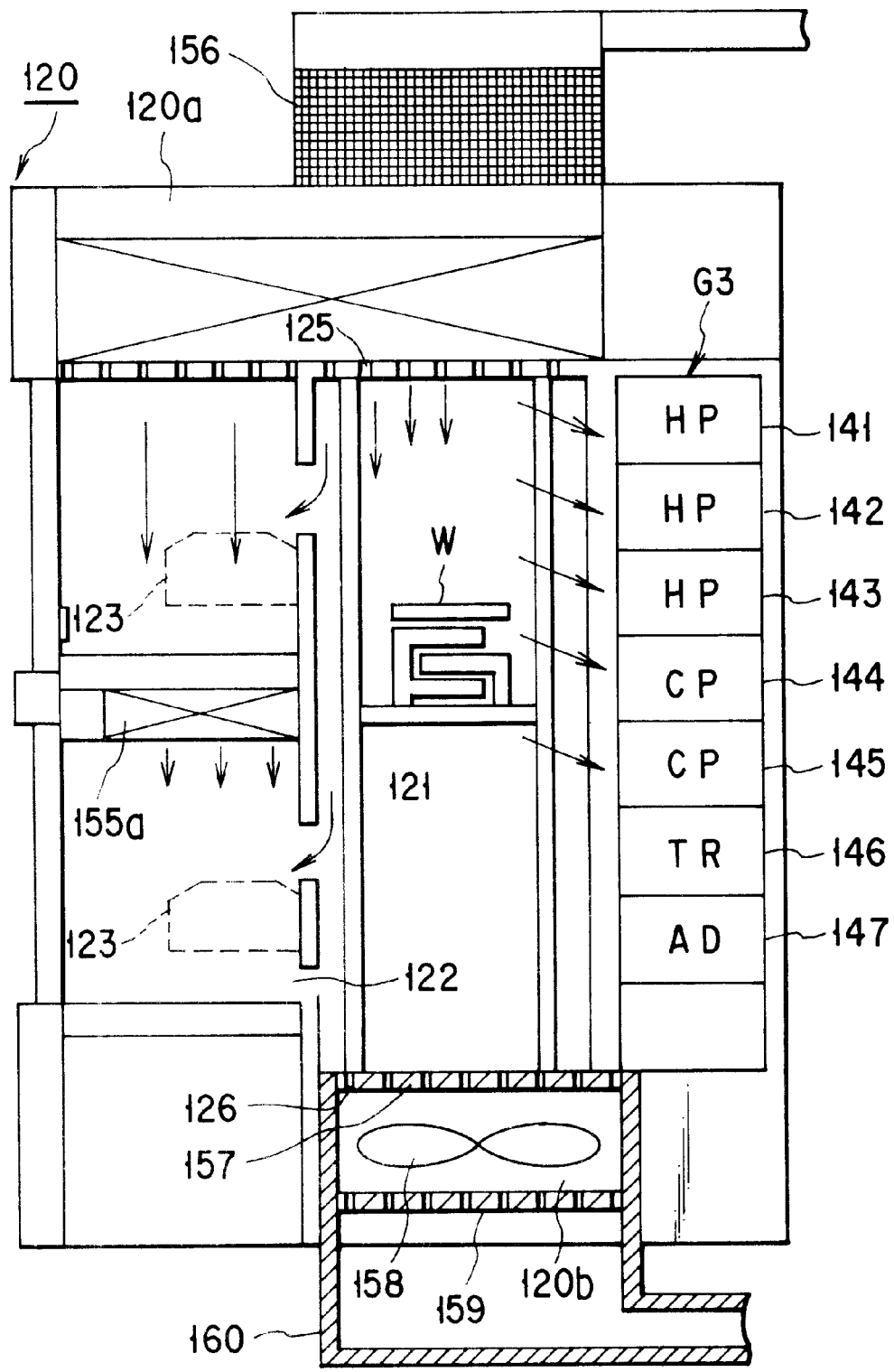
FIG. 12 is a schematic diagram of the flow of clean area in the photoresist coating and developing system of FIG. 8.

The processing system constructed as described above is installed in a clean room and increases the cleanness of the room. Additionally, in the system, the efficient supply of vertical laminar flow increases the cleanness in various sections of the clean room. FIGS. 11 and 12 show the flow of clean air in the system.

As shown in FIG. 11, air chambers 110a, 120a, and 130a are provided in the upper part of the cassette station 110, the processing station 120, and the interface section 130. A dust-proof filter, such as a ULPA filter 155, is provided on the bottom surface of each of the air chambers 110a, 120a, and 130a. Air is directed into the air chambers 110a and 130a via pipes. The air of the air chambers is filtered by the ULPA filter 155 and a down flow of clean air is supplied to the cassette station 110 and the interface section 130 from the ULPA filter 155.

As shown in FIG. 12, an air inlet 125 for supplying air to the transport path 122 is provided in the upper part of the wafer transport path 122 in the main wafer transport mechanism 121. An air outlet 126 for discharging the air supplied to the wafer transport path 122 is provided in the lower part of the wafer transport path 122.

The air chamber 120 is provided on the junction of the air inlet 125 and an air supply pipe. On the bottom surface of the junction, the ULPA filter 155 is provided. In the upper part of the junction, a chemical filter 156 is provided which has the function of removing organic contaminants, such as amine.

In the junction of the air outlet 126 and an exhaust pipe, an exhaust chamber 120b is provided. On the top surface of the exhaust chamber 120b, a porous plate 157 in which an air outlet 126 is made is provided. In the exhaust chamber 120b, an exhaust fan 155 is provided. In the junction of the exhaust chamber 120b and the exhaust pipe, pressure regulator means, for example, a slit damper 159, is provided. An air supply device (not shown) forms a down flow of clean air from the air inlet 125 to the air outlet 126 in the transport path 122.

In the cassette station 110, the upper space in the cassette table 102 is separated from the moving space in the wafer transport tweezers 104 with a hanging partition 105 so that a down flow of air may run independently in both of the spaces as shown in FIG. 11.

In the processing station 120, a ULPA filter 155a is provided on the ceiling of the photoresist coating unit (COT) located at the lower stage of each of the processing sections G1 and G2 as shown in FIGS. 11 and 12. The air supplied from a circulatory pipe 152 to the transport path 122 passes through the ULPA filter 155a and flows into the photoresist coating unit (COT).

As shown in FIG. 11, on each of the sidewalls of the spinner-type processing units (COT) and (DEV) facing the main wafer transport mechanism 121, an opening section 164 for allowing the wafer W and the transport arm to go in and out is provided. Each opening section 164 is provided with a shutter (not shown) that prevents particles or organic contaminants from each unit from getting into the main wafer transport mechanism 121.

As shown in FIG. 11, fire detectors 113, 114, and 115 are provided on each of or at least one of the cassette station 110, processing station 120, and interface section 130.

FIG. 13 is a sectional view of the section including the photoresist coating unit (COT) and developing unit (DEV).

In the section including the photoresist coating unit (COT) and developing unit (DEV), a tubular cup CP is provided in the center of the bottom of the unit. Inside the cup, a spin chuck 171 is provided. The spin chuck 171 is allowed to be rotated by a driving motor 172, while securing the semiconductor wafer W in place by vacuum adsorption. The driving motor 172 is provided at an opening 174 in a unit bottom plate 173 so that it can move up and down. The driving motor is connected to an up-and-down movement driving device 176 comprising, for example, an air cylinder, and an up-and-down movement guide device 177 via a cap-like flange member 175 made of, for example, aluminum. On the side of the driving motor 172, a tubular cooling jacket 178 made of, for example, stainless steel (SUS), is provided. The flange member 175 is provided so as to cover the upper half of the cooling jacket 178.

At the time of photoresist coating or development, the bottom end 175a of the flange member 175 comes into close contact with the unit bottom plate 173 near the periphery of the opening 174, thereby sealing the inside of the unit. When semiconductor wafers W are delivered between the spin chuck 171 and the main wafer transport mechanism 121, the bottom end of the flange member 175 rises from the unit bottom plate 173 because the up-and-down movement driving means 176 moves the section including the driving motor 172 and the spin chuck 171 upward.

In the cooling jacket 178, a watercourse for allowing cooling water to flow is provided. A cooling water supply section (not shown) circulates cooling water CW regulated at a constant temperature in the jacket.

Between the bottom surface of the cup CP and the unit bottom plate 173, there is a clearance 179. As described above, a down flow of the clean air whose temperature and humidity are controlled by the ULPA filter 155 on the ceiling to constant values is supplied to the unit. The clean air striking the unit bottom plate 173 around the cup CP passes through the clearance 179 below the cup CP and goes around into the inside of the cup CP. Because in coating photoresist, the bottom end 175a of the flange member 175 is in close contact with the unit bottom plate 173 near the periphery of the opening 174 and seals the unit as described above, the clean air passing through the clearance 179 and coming around into the inside of the cup CP goes up along the side of the flange member 158 as shown by doted lines A, passes through a clearance 180 between the periphery of the wafer W and the cup CP, and goes into the cup CP. That is, the passing of a current of air through the clearance from the inside to the outside prevents the photoresist solution from going around to the back of the wafer.

The heat generated by the driving motor 172 is absorbed by the cooling jacket 178 rapidly. In addition, because the flange member 175 covers the cooling jacket 178, the clean air passed through the clearance 179 and come around into the inside of the cup CP is not heated when passing by the driving motor 172. Since the clean air from the ULPA filter 155 on the ceiling goes around under the cup CP and is supplied to the clearance 180, while keeping its temperature and humidity almost constant, the periphery of the semiconductor wafer W will not be heated by the current of air on the wafer's back, assuring the uniformity of the photoresist film.

In the cup CP, the outer wall surface, the inner wall surface, and the bottom surface form a chamber. One or a plurality of drains 181 are made in the bottom surface. The drain 181 is connected to a tank 183 via a drain pipe 132. The tank 183 is an airtight container. A discharge outlet 183a is made in the bottom surface of the tank and an air inlet 183b is made in the top surface. Exhaust gas and waste liquor are discharged out of the system via pipes 184 and 185, respectively. Outside the tank 183, liquid surface sensors 186 and 187 for sensing the liquid surface in the tank are provided at specific different heights.

The photoresist solution scattered from the semiconductor wafer W in all directions during photoresist coating or development is collected in the cup CP as shown by a solid line B. The collected solution is sent as a waste liquor from the drain 181 at the bottom of the cup CP to the tank 183 via the drain pipe 182. At this time, the gas in the cup CP is also discharged as exhaust gas, together with the waste liquor, from the drain 181. A solvent, such as thinner, is supplied via a pipe (not shown) to the tank 183. The solvent allows the photoresist solution to be temporarily stored in the tank, without hardening. When the liquid surface in the tank 183 rises to the upper limit, a control circuit (not shown) opens an on-off valve 188 in the pipe 184 in response to the output signal SH from the liquid surface sensor 186. When the liquid surface in the tank 183 drops to the lower limit, the control circuit closes the on-off valve 188 in response to the output signal SL from the liquid surface sensor 187. After the waste liquor from the cup CP has been temporarily stored in the tank 183, it is sent via the pipe 184 to the outside of the system. The exhaust gas sent to the tank 183 is sent from the exhaust vent 183b through the pipe 185 to the outside of the system.

A nozzle 189 for supplying a photoresist solution and a developing solution to the surface of the semiconductor wafer W is connected via a supply pipe 190 to a supply section (not shown) for the photoresist solution and developing solution. The nozzle 189 is provided at the tip of a nozzle scan arm 191 with a nozzle standby section (not shown) on the outside of the cup CP in such a manner that the nozzle can be installed and removed. The nozzle is designed to be transported to a specific solution emission position in the upper part of the spin chuck 171. The nozzle scan arm 191 is provided on the top end of a vertical support member 193 that can move horizontally over a guide rail 192 laid in one direction (in the direction of Y) on the unit bottom plate 173. The scan arm is driven by a Y-direction driving mechanism (not shown) in such a manner that the arm, together with the vertical support member 193, moves in the direction of X.

Figure 14:
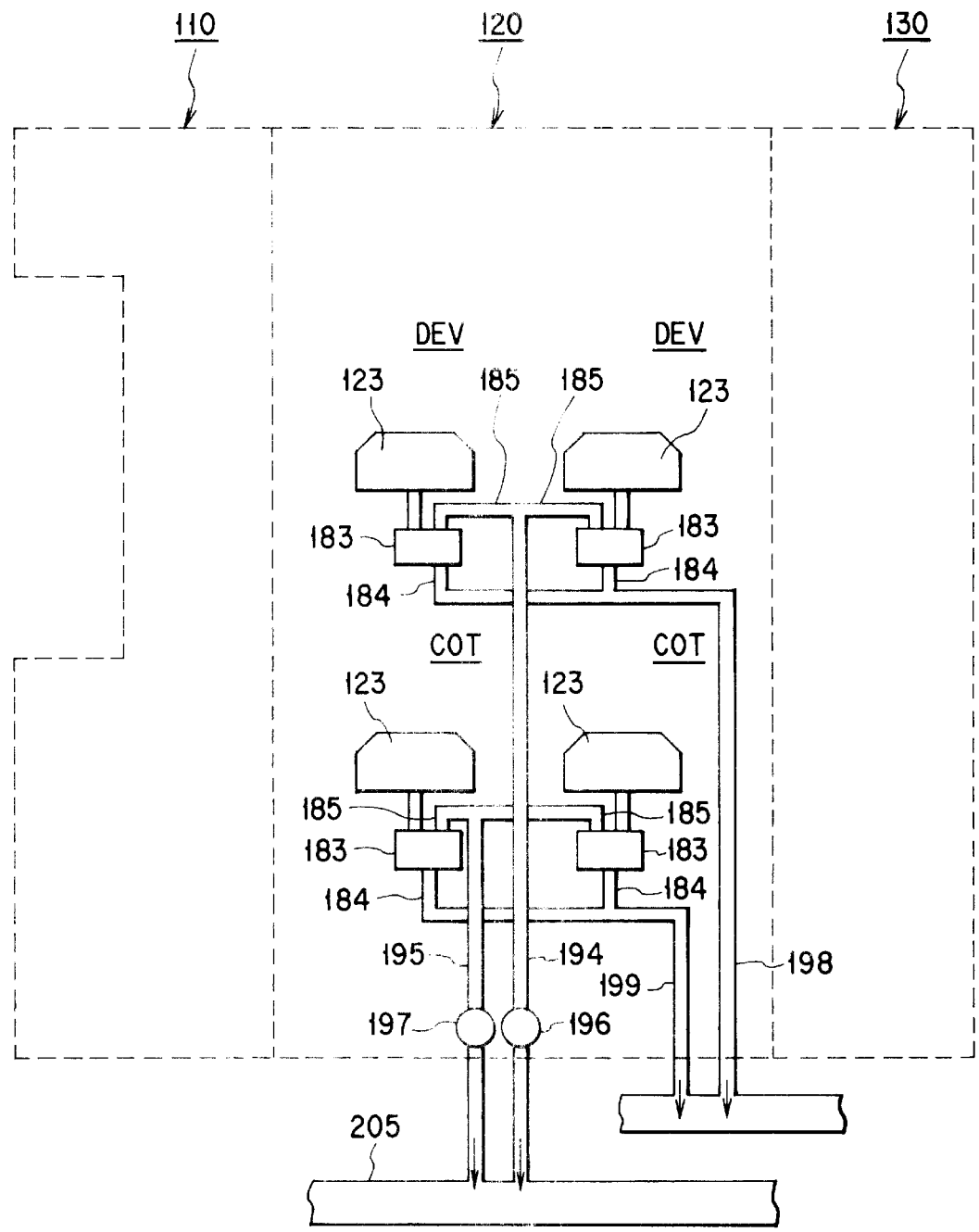
FIG. 14 is a schematic front view of the exhaust pipe and waste liquor pipe in the photoresist coating unit (COT) and developing unit (DEV) in the photoresist coating and developing system of FIG. 8.

FIG. 14 is a schematic front view of the exhaust pipe and waste liquor pipe in the photoresist coating unit (COT) and developing unit (DEV).

In the photoresist coating and developing system, the exhaust gas and waste liquor discharged from the photoresist coating unit (COT) and developing unit (DEV) are discharged out of the system via the exhaust pipe and waste liquor pipe.

The exhaust pipe 185 of the tank 183 in each developing unit (DEV) is connected to a common exhaust pipe 194. The exhaust pipe 185 of the tank 183 in each photoresist coating unit (COT) is connected to a common exhaust pipe 195. These exhaust pipes 194 and 195 are extended out of the system. On the exhaust pipes 194 and 195, blocking means for blocking the exhaust pipes 194 and 195 in case of emergency (e.g., a fire), for example, blocking mechanisms 196 and 197, are provided.

The waste liquor pipe 184 of the tank 183 in each developing unit (DEV) is connected to a common waste liquor pipe 198. The waste liquor pipe 184 of the tank 183 in each photoresist coating unit (COT) is connected to a common waste liquor pipe 199. These waste liquor pipes 198 and 199 are extended out of the exterior, i.e., factory exhaust pipe 210.

While the exhaust pipes 196 and 197 are provided in each of the developing unit (DEV) and photoresist coating unit (COT), they may be combined into a single exhaust pipe. The same is true for the waste liquor pipes 198 and 199.

Figure 15:
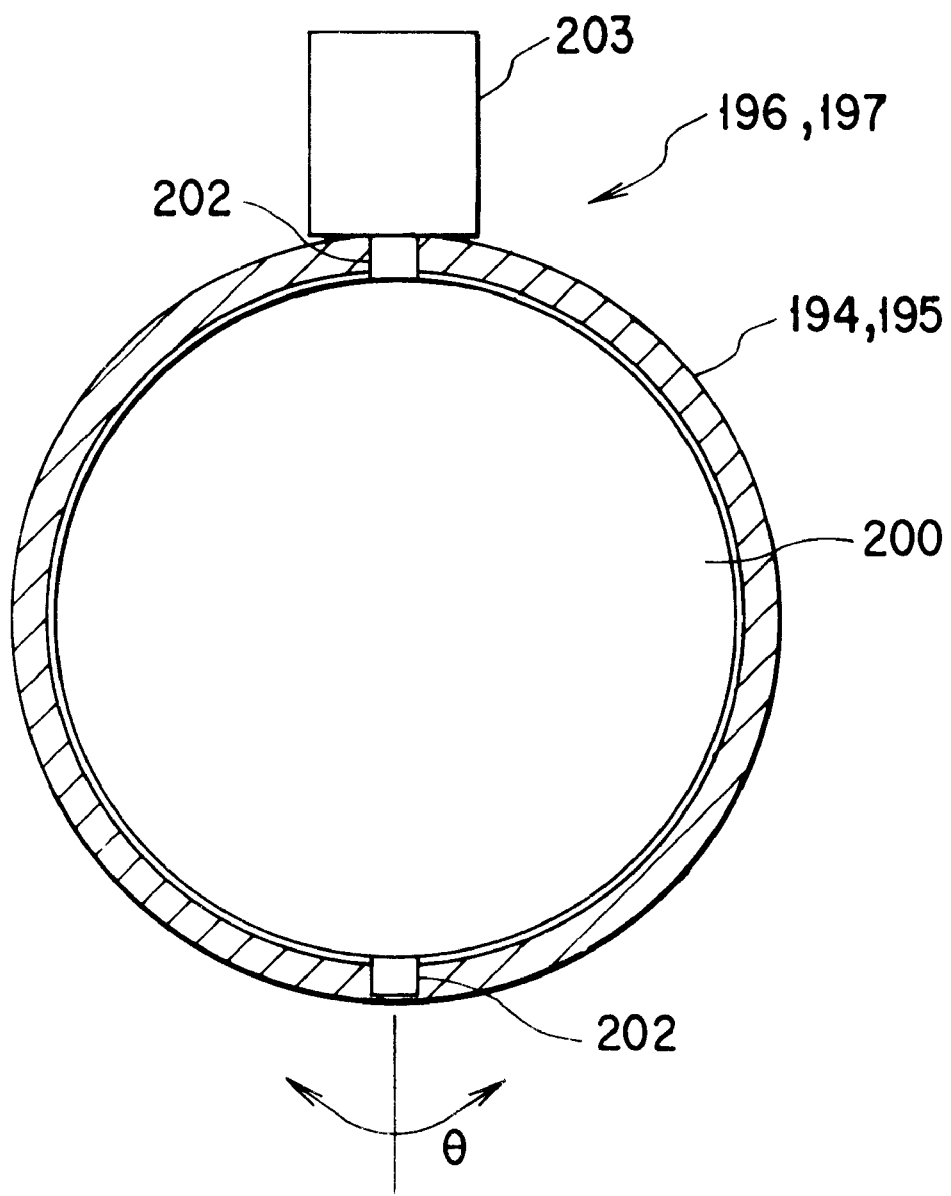
FIG. 15 shows the configuration of the blocking mechanism shown in FIG. 14.

FIG. 15 shows an example of the blocking mechanisms 196 and 197, acting as blocking means. In the exhaust pipe 194, a round blocking plate 200 having the same inner diameter as that of the exhaust pipe 194 is provided. Similarly, in the exhaust pipe 195, a round blocking plate 200 having the same inner diameter as that of the exhaust pipe 195 is provided. An axis 201 at the bottom of the blocking plate 200 is supported by the exhaust pipes 194 and 195 in such a manner that the axis can rotate in the direction of θ. The axis 202 at the top of the blocking plate 200 is supported by the exhaust pipes 194 and 195 in such a manner that the axis can rotate in the direction of θ. These axes are extended out of the exhaust pipes 194 and 195.

The top axis 202 is connected to a rotary motor 203. The blocking plate 200 is rotated by the motor 203 in the direction of θ. FIG. 15 shows an emergency state, that is, a state where the blocking plates 200 block the exhaust pipes 194 and 105 and prevents the exhaust gas from passing through. The blocking plate 200 is normally in a position 90° rotated in the direction of θ from the position in FIG. 15.

Figure 16:
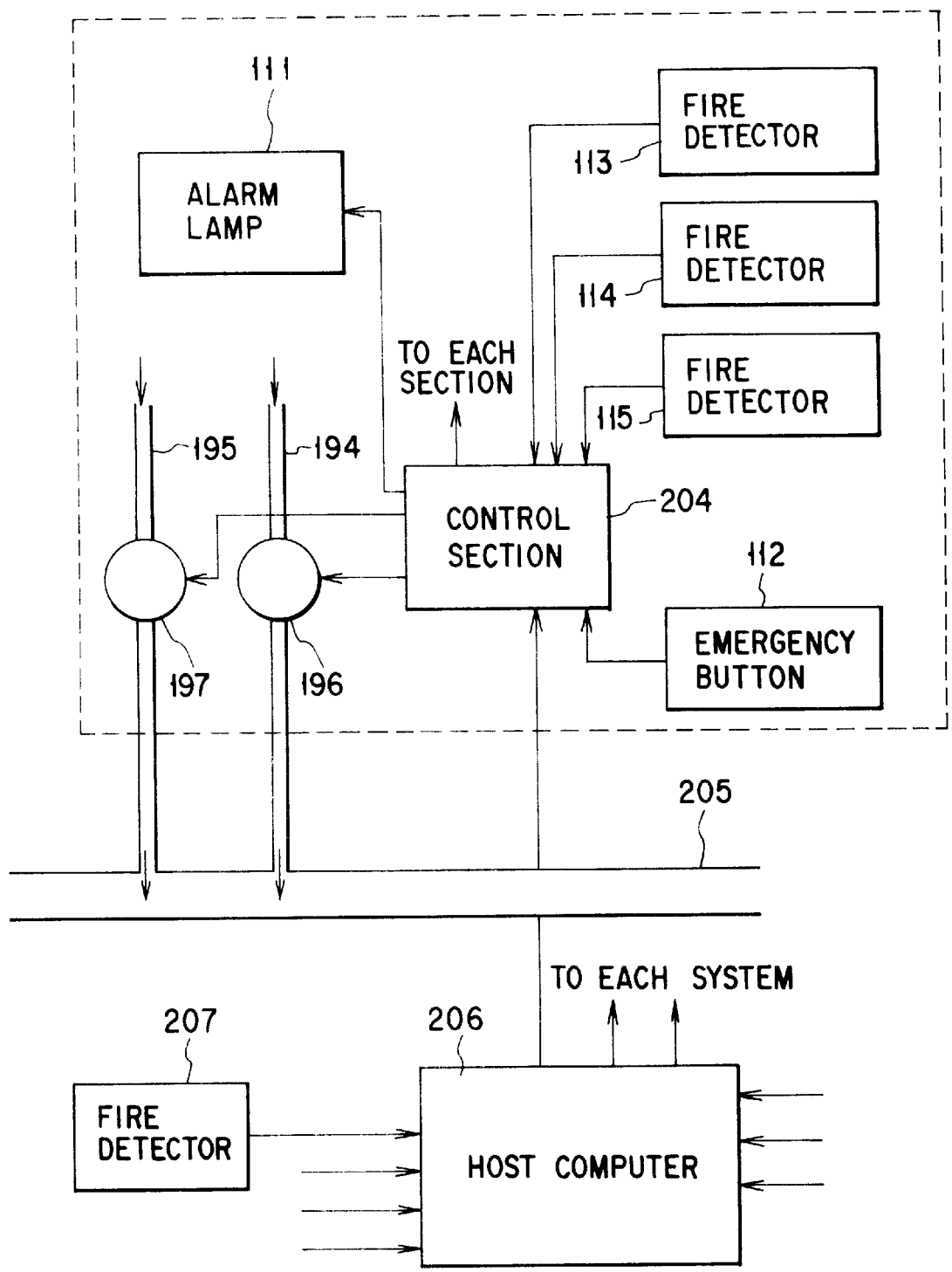
FIG. 16 shows the configuration of the control system of the photoresist coating and developing system shown in FIG. 8.

FIG. 16 shows the configuration of the control system of the photoresist coating and developing system. A control section 204 supervises the control of the entire system. The control section receives the signals from the emergency button 112, the fire detectors 113, 114, and 115, and other sections in the system and then turns on the alarm lamp 111, opens and closes the blocking mechanisms 196 and 197, and controls other various sections.

When the photoresist coating and developing system is installed in, for example, a factory, the exhaust pipes 194 and 195 extended out of the system are connected to an exhaust pipe 205 laid in the factory as shown in FIG. 16. The exhaust gas is collected into, for example, an exhaust tank (not shown) via the exhaust pipe 205. The photoresist coating and developing system is connected to a host computer 206 installed in the factory. The computer performs centralized control. For example, when the host computer 206 receives the signal indicating that a fire has broken out, from the fire detector 207 in the factory, it informs the photoresist coating and developing system of the occurrence of a fire.

Explanation of the operation of the control section 204 will be given.

For example, when a fire has started in the photoresist coating and developing system and the fire has been detected by any one of the fire detectors 113, 114, and 115 in the system, the sensed signal is sent to the control section 204. Receiving the signal, the control section 204 turns on the alarm lamp 111 and sends a blocking signal to cause the blocking mechanisms 196 and 196 to block the pipes. In the each of blocking mechanisms 196 and 196, the motor 203 rotates the blocking plate 200 90° in the direction of θ in response to the blocking signal, which produces the state shown in FIG. 15. In this state, the exhaust pipes 194 and 195 are blocked. This prevents the fire in the photoresist coating and developing system from spreading out of the system via the exhaust pipes 194, 195, and 205.

In other words, since the exhaust pipe 194 and 195 which are filled with organic solvent, such as thinner contained usually in the photoresist solution and the developing solution are segregated from the factory exhaust pipe 205 by closing the exhaust pipes 194 and 195, the fire is prevented to spread out through the pies 194, 195 and 205 to the exterior.

On the other hand, for example, when a fire has broken out in the factory and the fire detector 207 has detected the fire, the sensed signal is sent to the control section 204 in the system via the host computer 206. Receiving the signal, the control section 204, as described above, turns on the alarm lamp 111 and sends a blocking signal to cause the blocking mechanisms 196 and 197 to block the pipes. Then, the blocking mechanisms 196 and 197 block the pipes 194 and 195. This prevents the fire in the factory from spreading into the photoresist coating and developing system via the exhaust pipes 194, 195, and 105.

When the operator has pressed the emergency button 122, the control section 204, receiving the signal, turns on the alarm lamp 111 and sends a blocking signal to cause the blocking mechanisms 196 and 197 to block the pipes. Then, the blocking mechanisms 196 and 197 block the pipes 194 and 195. The use of the emergency button 112 is particularly useful when, for example, the fire detectors do not work.

While in the embodiment, the alarm lamp is turned on and the blocking mechanisms block the pipes, the supply section may be caused to stop the supply of the photoresist solution and developing solution to the nozzle 189 of FIG. 13 in addition to the turning on of the alarm lamp and the blocking of the pipes by the blocking mechanisms. This narrows the range the fire can spread. After the blocking operation, all of of the photoresist coating and developing system may be turned off.

The embodiment for preventing the spread of the fire as shown in FIGS. 14 to 16 may be applied to the embodiments shown in FIGS. 1 to 7. In this case, a fire alarm is mounted on each processing set.

While in the embodiment, a semiconductor wafer has been used as objects, the present invention is not limited to this. For instance, the invention may be applied to LCD substrates, glass substrates, CD substrates, photomasks, printed-circuit boards, and ceramic boards.

With the above embodiment, because the exhaust pipes that discharge the atmosphere in the processing chamber out of the systemn are blocked in case of emergency, such as a fire inside or outside the system, it is possible to prevent not only a fire outside the system from spreading into the system via the exhaust pipes but also a fire in the system from spreading out of the system and all over the factory.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

We claim:

1. A processing apparatus comprising:
    a plurality of processing sets, each set including a transport path extending vertically, a plurality of processing sections which are arranged around said transport path and each have a plurality of processing units laid one on top of another vertically, for performing a specific process on each object, and a first main transport mechanism which moves along said transport path, loads said object on and unloads said object from each processing unit in said plurality of processing sections of each of the processing sets, the first main transport mechanism being independent from a second main transport mechanism provided on each of the remaining ones of the processing sets, and the processing sections of adjacent ones of the processing sets having first and second transport units, respectively, which are juxtaposed to each other and each of which is inserted between the processing units laid one on top of another vertically; and
    an inter-set transport mechanism arranged in the first and second transport units for transporting an object therebetween independently from the first main transport mechanism and the second main transport mechanism.

2. A processing apparatus according to claim 1, wherein said adjacent processing sets each include processing sections, each having a transport unit, and are arranged side by side so that these processing sections may be adjacent to each other, and said interset transport mechanism transports a substrate via said transport units in the adjacent processing sections.

3. A processing apparatus according to claim 2, wherein said transport units in said adjacent processing sections are positioned at substantially the same height.

4. A processing apparatus according to claim 3, wherein each of said transport units in said adjacent processing sections includes two transport boats and two stages corresponding to the boats.

5. A processing apparatus according to claim 4, wherein said inter-set transport mechanism has two transport arms, one of said transport arms transporting objects from one stage of said transport units to one other stage of said transport units, and the other of said transport arms transporting objects from said one other stage of said transport units to said one stage of said transport units.

6. A processing apparatus according to claim 3, wherein said transport units in said adjacent processing sections have stages that can move independently, said inter-set transport mechanism includes a moving mechanism that moves said stages independently and a rail for guiding these stages, objects brought into one of said transport units is put on said one stage, guided together with said one stage over said rail, and transported to said one other of said transport units, and objects brought into said one other of said transport units is put on said one other stage, guided together with said one other stage over said rail, and transported to said one of said transport units.

7. A processing apparatus according to claim 1, further comprising a processing chamber for treating objects with organic solvent, an exhaust path for discharging the atmosphere in said processing chamber from the apparatus, and blocking means for blocking said exhaust path in case of emergency.

8. A processing apparatus according to claim 7, further comprising notifying means for notifying that said blocking means has blocked said exhaust path.

9. A processing apparatus according to claim 1, further comprising a processing chamber for treating objects with organic solvent, an exhaust path for discharging the atmosphere in said processing chamber from the apparatus, input means for inputting a fire sense signal from outside the apparatus, and blocking means for blocking said exhaust path when receiving said fire sense signal.

10. A processing apparatus according to claim 1, further comprising a processing chamber for treating objects with organic solvent, an exhaust path for discharging the atmosphere in said processing chamber from the apparatus, fire sensing means for sensing a fire in the apparatus, and blocking means for blocking said exhaust path when said fire sensing means has sensed a fire.

11. A processing apparatus according to claim 1, further comprising a processing chamber for treating objects with organic solvent, an exhaust path for discharging the atmosphere in said processing chamber from the apparatus, an emergency button, and blocking means for blocking said exhaust path when said emergency button is pressed.

12. A processing apparatus comprising:
a plurality of processing sets, each set including a transport path extending vertically, at least one first processing section having a plurality of processing units which are arranged along said transport path, laid one on top of another vertically, and include photoresist coating units for coating objects with photoresist and/or developing units for developing a pattern of photoresist, a second processing section having a plurality of processing units which arelaid one on top of another vertically and include a heating unit for heating objects, a cooling unit for cooling objects, and a transport unit for transporting objects, and first a main transport mechanism which moves along said transport path, loads said objects on and unloads said objects from each processing unit in said first and second processing sections of each of the processing sets, the first main transport mechanism being independent from a second main transport provided on each of the remaining ones of the processing sets and the processing sections of adjacent ones of the processing sets having first and second transport units, respectively, which are juxtaposed to each other and each of which is inserted between the processing units laid one on top of another vertically; and an inter-set transport mechanism arranged in the first and second transport units for transporting objects between the adjacent processing sets;

wherein said adjacent processing sets are arranged side by side so that the second processing sections may be adjacent to each other, and said inter-set transport mechanism transports objects via the transport units in the adjacent second processing sections.

13. A processing apparatus comprising:
a plurality of processing sets, each set including a transport path extending vertically, at least one first processing section including a plurality of processing units which are arranged around said transport path, laid one on top of another, and include photoresist coating units for coating objects with photoresist and/or developing units for developing a pattern of photoresist, a second processing section including a plurality of processing units which are laid one on top of another vertically and include a heating unit for heating objects, a cooling unit for cooling objects, and a transport unit for transporting objects, and a first main transport mechanism which moves along said transport path to load said objects on and unload said object from each processing unit in said first and second processing sections of each of the processing sets, the first main transport mechanism being independent from a second main transport provided on each of the remaining ones of the processing sets and the processing sections of adjacent ones of the processing sets having first and second transport units, respectively, which are juxtaposed to each other and each of which is inserted between the processing units laid one on top of another vertically; and a processing station for performing a series of processes, including a photoresist coating and developing processes, on objects;

a transport station for delivering objects to another apparatus and to said processing station;

an interface section for delivering objects to said processing station and to an exposure apparatus; and an inter-set transport mechanism arranged in the first and second transport units for transporting objects therebetween independently from the first main transport mechanism and the second main transport mechanism, wherein said adjacent processing sets are arranged side by side so that the second processing sections may be adjacent to each other, and said inter-set transport mechanism transports objects via the transport units in the adjacent second processing sections.

14. A processing apparatus according to claim 13, wherein the transport units in said adjacent second processing sections are positioned at the same height.

15. A processing apparatus according to claim 13, wherein each of said transport units has two transport boats and uses one boat when bringing in objects and the other boat when carrying out objects.

16. A processing apparatus according to claim 13, wherein said inter-set transport mechanism has a transport arm for transporting objects between one transport unit and another transport unit.

17. A processing apparatus according to claim 13, wherein said inter-set transport mechanism has moving means that moves objects stage to transport objects between one transport unit and another transport unit.

18. A processing apparatus according to claim 13, wherein each of said processing sets further includes down flow forming means for forming a down flow in said transport path.

19. A processing apparatus according to claim 18, wherein said down flow forming means includes an air intake provided at the top end of said transport path, an exhaust vent provided at the bottom end of said transport path, and a filter mechanism that is provided at said air intake and purifies the taken-in air.

20. A processing apparatus according to claim 13, wherein each of said processing sets further includes atmosphere control means for controlling the atmosphere in said transport path.

21. A processing apparatus according to claim 20, wherein said atmosphere control means controls the atmosphere in the transport path in each of said processing sets independently.

22. A processing apparatus according to claim 13, wherein at least one of the second processing sections in said processing sets is composed of a heating unit, a cooling unit, and a transfer unit, with the heating unit above the transport unit and the cooling unit below the transport unit.

23. A processing apparatus according to claim 13, wherein at least one of the second processing sections in said processing sets includes a heating unit, a cooling unit, a transfer unit, and an adhesion processing unit for performing an adhesion process on objects, with the heating unit and cooling unit above the transport unit in that order from the top and the adhesion processing unit below the transport unit, and also includes down flow forming means for forming a down flow in said transport path.

24. A processing apparatus according to claim 13, wherein said transport station is provided on one side of said processing station, and said inter-set transport mechanism transports objects from one processing set adjacent to said transport station to one other processing set adjacent to the one processing set and, after the process has been completed, returns the objects from said one other processing set to said one processing set and further to said transport station.

25. A processing apparatus comprising:
   a plurality of processing sets, each set including a transport path extending vertically, a plurality of processing sections which are arranged around said transport path and each have a plurality of processing units laid one on top of another vertically, for performing a specific process on each object, and a main transport mechanism which moves along said transport path, loads said object on and unloads said object from each processing unit in said plurality of processing sections; and
   an inter-set transport mechanism for transporting objects between the adjacent processing sets;
   wherein said adjacent processing sets each include processing sections, each having a transport unit, and are arranged side by side so that these processing sections may be adjacent to each other, and said inter-set transport mechanism transports a substrate via said transport units in the adjacent processing sections;
   wherein said transport units in said adjacent processing sections are positioned at substantially the same height;
   wherein each of said transport units in said adjacent processing sections includes two transport boats and two stages corresponding to the boats.

26. A processing apparatus according to claim 25, wherein said inter-set transport mechanism has two transport arms, one of said transport arms transporting objects from one stage of said transport units to one other stage of said transport units, and the other of said transport arms transporting objects from said one other stage of said transport units to said one stage of said transport units.

27. A processing apparatus comprising:
   a plurality of processing sets, each set including a transport path extending vertically, a plurality of processing sections which are arranged around said transport path and each have a plurality of processing units laid one on top of another vertically, for performing a specific process on each object, and a main transport mechanism which moves along said transport path, loads said object on and unloads said object from each processing unit in said plurality of processing sections; and
   an inter-set transport mechanism for transporting objects between the adjacent processing sets;
   wherein said adjacent processing sets each include processing sections, each having a transport unit, and are arranged side by side so that these processing sections may be adjacent to each other, and said inter-set transport mechanism transports a substrate via said transport units in the adjacent processing sections;
   wherein said transport units in said adjacent processing sections are positioned at substantially the same height;
   wherein said transport units in said adjacent processing sections have stages that can move independently, said inter-set transport mechanism includes a moving mechanism that moves said stages independently and a rail for guiding these stages, objects brought into one of said transport units is put on said one stage, guided together with said one stage over said rail, and transported to said one other of said transport units, and objects brought into said one other of said transport units is put on said one other stage, guided together with said one other stage over said rail, and transported to said one of said transport units.

28. A processing apparatus comprising:
   a plurality of processing sets, each set including a transport path extending vertically, at least one first processing section including a plurality of processing units which are arranged around said transport path, laid one on top of another, and include photoresist coating units for coating objects with photoresist and/or developing units for developing a pattern of photoresist, a second processing section including a plurality of processing units which are laid one on top of another vertically and include a heating unit for heating objects, a cooling unit for cooling objects, and a transport unit for transporting objects, and a main transport mechanism which moves along said transport path to load said objects on and unload said object from each processing unit in said first and second processing sections;
   a processing station for performing a series of processes including photoresist coating and developing processes, on objects;
   a transport station for delivering objects to another apparatus and to said processing station;
   an interface section for delivering objects to said processing station and to an exposure apparatus; and an inter-set transport mechanism for transporting objects between said adjacent processing sets;

wherein said adjacent processing sets are arranged side by side so that the second processing sections may be adjacent to each other, and said inter-set transport mechanism transports objects via the transport units in the adjacent second processing sections, and wherein each of said processing sets further includes down flow forming means for forming a down flow in said transport path.

29. A processing apparatus according to claim 28, wherein said down flow forming means includes an air intake provided at the top end of said transport path, an exhaust vent provided at the bottom end of said transport path, and a filter mechanism that is provided at said air intake and purifies the taken-in air.

30. A processing apparatus comprising:

a plurality of processing sets, each set including a transport path extending vertically, at least one first processing section including a plurality of processing units which are arranged around said transport path, laid one on top of another, and include photoresist coating units for coating objects with photoresist and/or developing units for developing a pattern of photoresist, a second processing section including a plurality of processing units which are laid one on top of another vertically and include a heating unit for heating objects, a cooling unit for cooling objects, and a transport unit for transporting objects, and a main transport mechanism which moves along said transport path to load said objects on and unload said object from each processing unit in said first and second processing sections;

a processing station for performing a series of processes, including photoresist coating and developing processes, on objects;

a transport station for delivering objects to another apparatus and to said processing station;

an interface section for delivering objects to said processing station and to an exposure apparatus; and an inter-set transport mechanism for transporting objects between said adjacent processing sets;

wherein said adjacent processing sets are arranged side by side so that the second processing sections may be adjacent to each other, and said inter-set transport mechanism transports objects via the transport units in the adjacent second processing sections;

wherein each of said processing sets farther includes atmosphere control means for controlling the atmosphere in said transport path;

wherein said atmosphere control means controls the atmosphere in the transport path in each of said processing sets independently.

31. A processing apparatus comprising:

a plurality of processing sets, each set including a transport path extending vertically, at least one first processing section including a plurality of processing units which are arranged around said transport path, laid one on top of another, and include photoresist coating units for coating objects with photoresist and/or developing units for developing a pattern of photoresist, a second processing section including a plurality of processing units which are laid one on top of another vertically and include a heating unit for heating objects, a cooling unit for cooling objects, and a transport unit for transporting objects, and a main transport mechanism which moves along said transport path to load said objects on and unload said object from each processing unit in said first and second processing sections;

a processing station for performing a series of processes, including photoresist coating and developing processes, on objects;

a transport station for delivering objects to another apparatus and to said processing station;

an interface section for delivering objects to said processing station and to an exposure apparatus; and an inter-set transport mechanism for transporting objects between said adjacent processing sets;

wherein said adjacent processing sets are arranged side by side so that the second processing sections may be adjacent to each other, and said inter-set transport mechanism transports objects via the transport units in the adjacent second processing sections, and said transport station is provided on one side of said processing station, and said interset transport mechanism transports objects from one processing set adjacent to said transport station to one other processing set adjacent to the one processing set and, after the process has been completed, returns the objects from said one other processing set to said one processing set and further to said transport station.

* * * * *